United States Patent [19]
Severt et al.

[11] Patent Number: 5,511,108
[45] Date of Patent: Apr. 23, 1996

[54] APPARATUS AND METHOD FOR PERFORMING AND CONTROLLING TESTING OF ELECTRICAL EQUIPMENT

[75] Inventors: David Severt, Spokane, Wash.; George Siegner, Post Falls; Daren Upchurch, Coeur D'Alene, both of Id.; William Erler; James Anselmo, both of Spokane, Wash.

[73] Assignee: Itronix Corporation, Spokane, Wash.

[21] Appl. No.: 987,480

[22] Filed: Dec. 4, 1992

Related U.S. Application Data

[63] Continuation-in-part of Ser. No. 709,033, May 31, 1991.
[51] Int. Cl.⁶ .............................. H04M 1/24; H04M 3/08; H04M 3/22
[52] U.S. Cl. .................... 379/21; 379/1; 379/11; 379/18; 379/22; 379/29
[58] Field of Search ................. 379/1, 11, 18, 379/21, 22, 29

[56] References Cited

U.S. PATENT DOCUMENTS

| | | | |
|---|---|---|---|
| D. 302,265 | 7/1989 | Siegner et al. | D14/100 |
| D. 302,524 | 9/1989 | Siegner et al. | D14/114 |
| 3,692,962 | 9/1972 | Raczynski | 379/11 |
| 3,870,836 | 3/1975 | Kusama | 379/21 |
| 4,159,402 | 6/1979 | De Graauw | 379/247 |
| 4,451,712 | 5/1984 | Kovarik | 379/22 |
| 4,455,644 | 6/1984 | Fox | 379/22 |
| 4,479,122 | 10/1984 | Redman | 379/22 |
| 4,641,299 | 2/1987 | Kemper | 379/29 |
| 4,843,620 | 6/1989 | Hagedorn | 379/21 |
| 5,025,466 | 6/1991 | Hilligoss | 379/21 |
| 5,127,041 | 6/1992 | O'Sullivan | 379/98 |
| 5,157,708 | 10/1992 | Garthwaite | 379/21 |

OTHER PUBLICATIONS

"Dynatel 745 Product Profile" Specifications, 3M Corporation.
"965 Subscriber Loop Analyzer" Specifications, 3M Corporation.
"Plantronics Wilcom Model T136BSB" Product Brochure.
Telecom Systems Group, "Instruction Manual, 900–T–Series, Test Set, Terminal Emulation Manual," Mar., 1992.
Telcom Systems Group, "Instruction Manual, 900–Series, Test Set, Operator's Manual," Mar., 1992.

Primary Examiner—Stephen Chin
Assistant Examiner—Vijay Shankar
Attorney, Agent, or Firm—Wells, St. John, Roberts, Gregory & Matkin

[57] ABSTRACT

An administrative computer and testing apparatus device is provided. The administrative computer is coupled to the testing apparatus so that the test data can be correlated with administrative information such as the location of the equipment tested. The testing apparatus can be configured as a slice for insertion between upper and lower portions of the administrative computer. The administrative computer can control the testing apparatus to provide testing in accordance with predefined test procedures. The administrative computer is user-programmable to permit user-defined test procedures to be established. Test data, e.g. test data correlated with the location information, can be communicated to a remote computer for further processing or analysis. Communication can be implemented through a modem, which can be a land-line modem or an RF or other wireless modem.

19 Claims, 34 Drawing Sheets

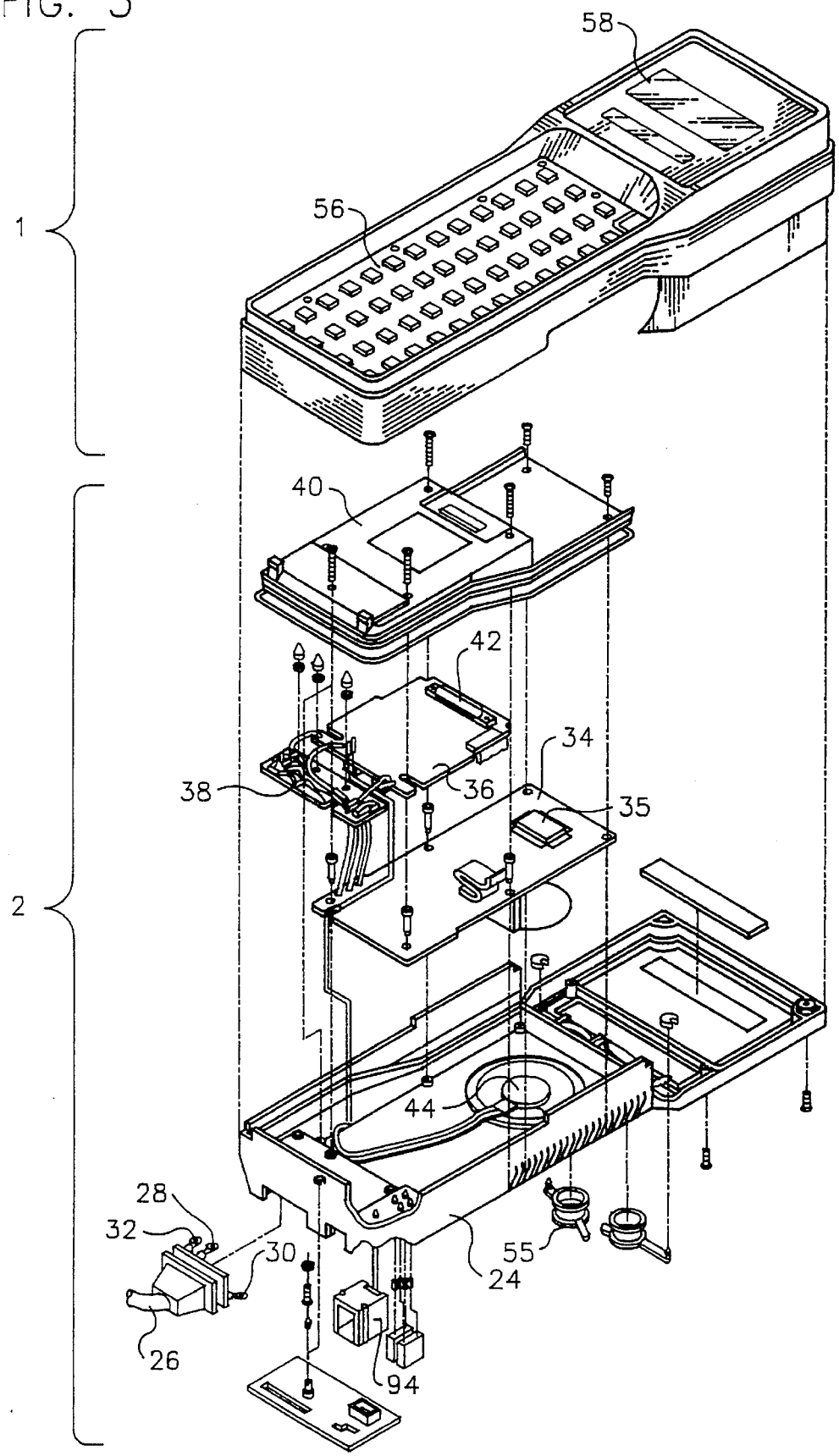

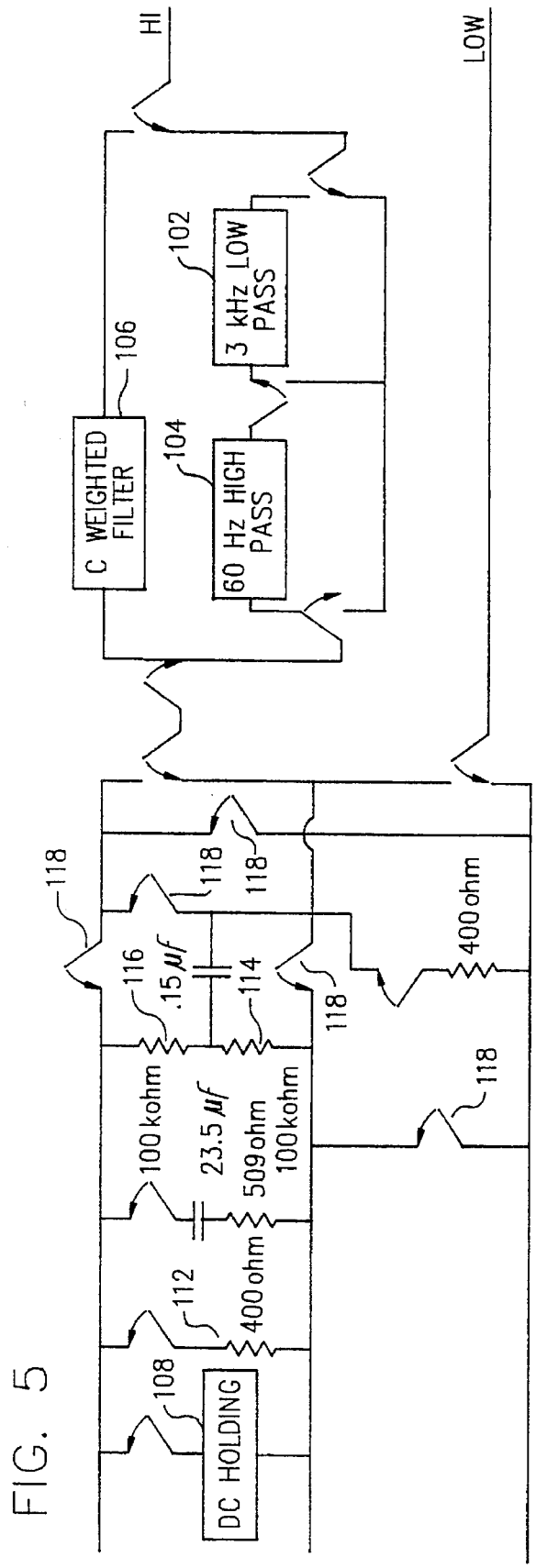
FIG. 5
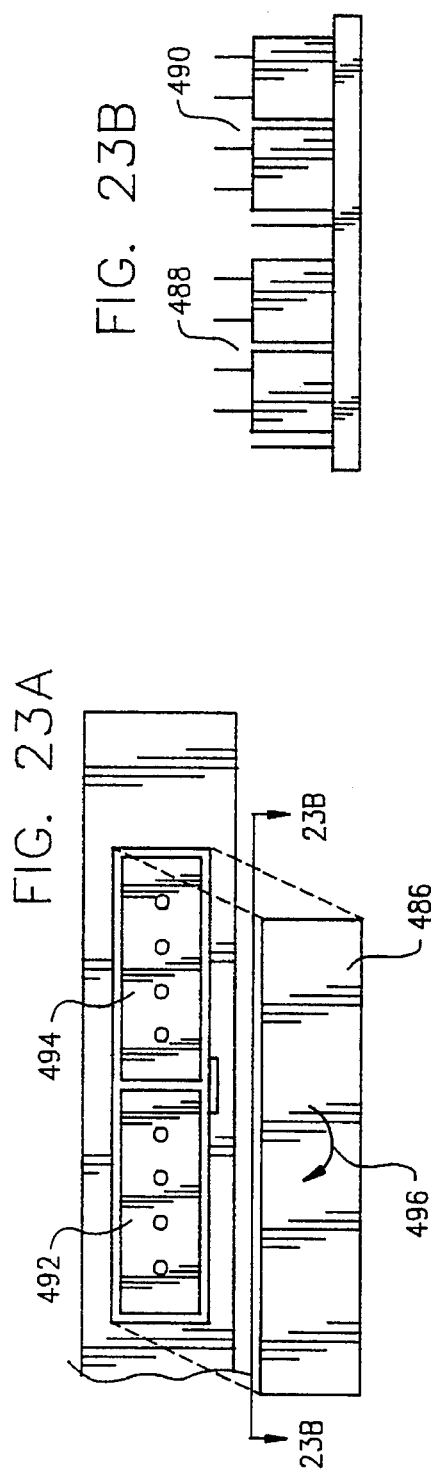
FIG. 23B
FIG. 23A

FIG. 11A 332

```
336     OHMS
   ┌ T-R:  *   122.3 Ohms
382┤  T-G:      27.00 kOhm
   └ R-G: >    40.00 kOhm

*EQUIVELANT LENGTH*
384┤ ┌ T-R:  7552 ft
     └ T-G:  HIGH RESISTANCE

CABLE GAUGE:    22 GA
   TEMPERATURE:   68.0 F
   CHANGE ? (Y/N)
```

FIG. 11B 334

```
338     VOLTS
   T-R: *     -52.0 V DC
   T-G:         0.0 V DC
   R-G:       -52.0 V DC

```
272 ─ (R)VIEW (P)RINT (D)EL
274 ─ (S)TORE RESULTS
      ─────────────────
      *(CURRENT RESULTS)
      MONDAY TEST    ┐
      TUESDAY TEST   ├─ 258
      MRS T 555-4631 ┘
```

FIG. 11D 326

```
12/21/90              12:30
      STANDARD TESTS
      ─────────────────
   1. VOLTS
   2. OHMS
   3. CAPACITANCE
   4. STATION TEST
   5. CIRCUIT LOSS
   6. GAIN/SLOPE
   7. CIRCUIT BALANCE

ENTER OPTION: _
```

FIG. 11E 328

```
12/21/90              12:30
       CUSTOM TESTS
       ─────────────
   1. FULL PAIR TEST
   2. NOISE TEST
   3. QUICK TEST
   4. CO STANDARDS

ENTER OPTION: _
```

FIG. 11F 352

```
12/21/90              12:30
      UTILITY FUNCTIONS
      ─────────────────
354 ─ 1. MAINTAIN RESULTS
366 ─ 2. EDIT PARAMETERS
362 ─ 3. LOAD CUSTOM TESTS
164 ─ 4. SELF TEST

ENTER OPTION: _
```

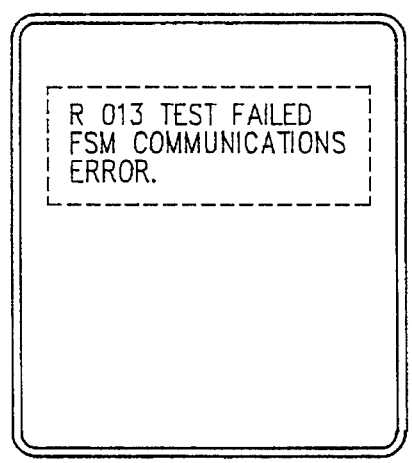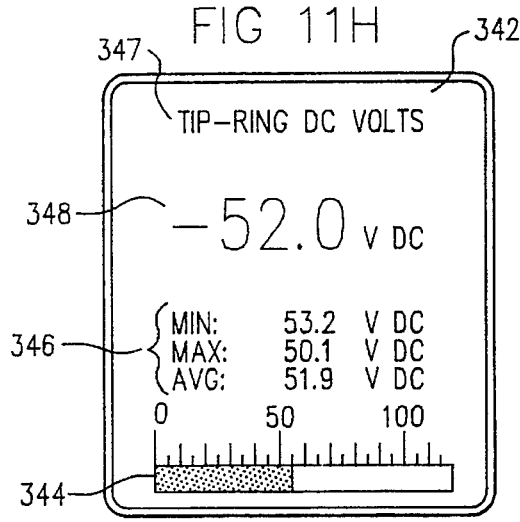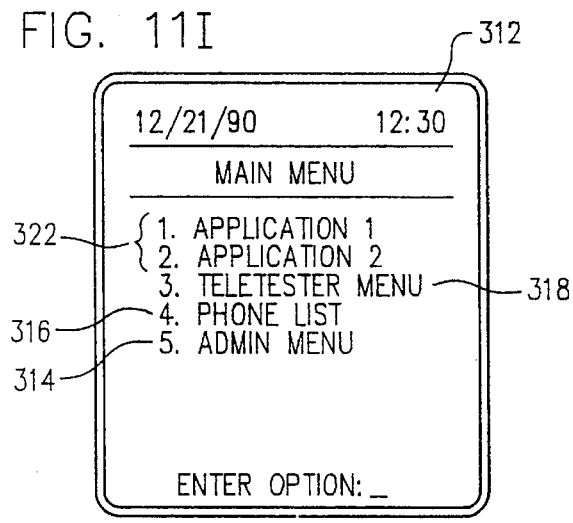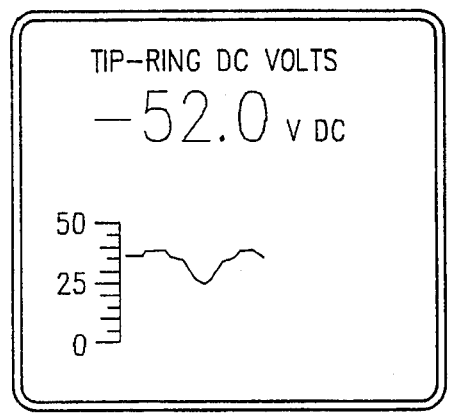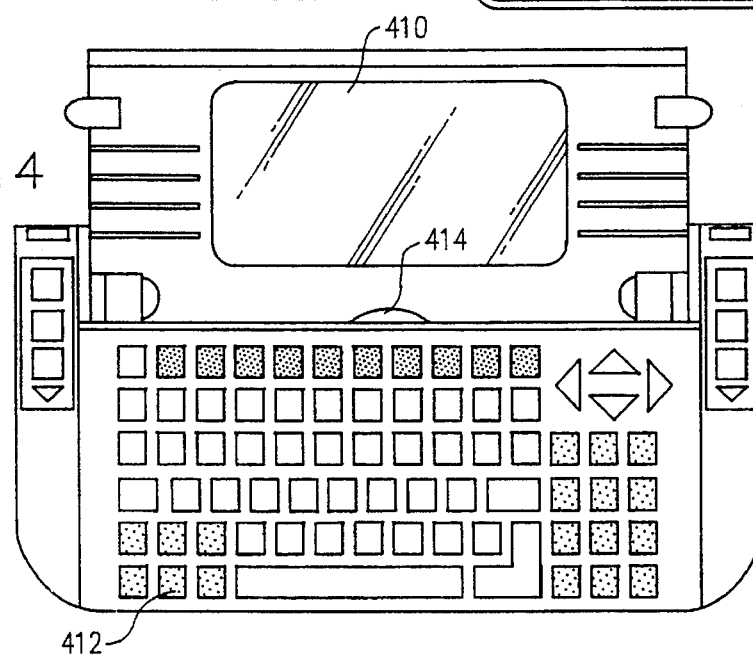

TRANSCONDUCTANCE
AMPLIFIER
(CONSTANT VOLTAGE AMP)

APPARATUS AND METHOD FOR PERFORMING AND CONTROLLING TESTING OF ELECTRICAL EQUIPMENT

This application is a continuation-in-part of co-pending U.S. application Ser. No. 07/709,033, filed May 31, 1991 for "Administrative Computer and Testing Apparatus", incorporated herein by reference.

BACKGROUND OF THE INVENTION

The present invention relates to portable apparatus which functions as an administrative computer, processing information relating to location or other administrative aspects of equipment to be tested, as well as having devices for performing the testing of equipment.

A number of industries include, as part of their operation, field representatives or similar personnel who perform service calls, including traveling to locations where company equipment is installed. Service calls include calls for the purpose of testing, repairing and maintaining equipment, as well as calls for the purpose of gathering data such as usage and billing data, and sales calls. One example of a field representative is a repair person for a telephone company who travels to locations where telephone equipment is installed for the purpose of testing and/or repairing the equipment. In the past, companies with field representatives have provided them with administrative computers for assisting with administrative functions such as storing and displaying the location of the equipment to be tested, addresses of customers who have requested service, and the like. The information can also include equipment serial number or other identifying information, "trouble" ticket information such as information identifying a report of an equipment malfunction by customer name and date of complaint, telephone numbers, and other location-identifying information. Administrative computers can also provide functions such as scheduling or dispatching field representatives, billing, storing information about the service call, and the like. The administrative computers are often portable. Some such computers are hand-held, that is, of sufficiently small size and weight that the computer can be held in one hand.

Although administrative computers have been used by field representatives, prior art administrative computers suffer from certain shortcomings. Typically, after an administrative computer has directed a field representative to make a service call, the field representative will make a report regarding the results of the service call. When the administrative computer is used in connection with making a report of test results, the field representative has been obligated to manually enter information into the administrative computer, usually by using a keyboard or keypad on the administrative computer. Such manual entry of information is time consuming and represents an opportunity for transcription errors. Further, in the past, the test-result information entered typically has involved only a summary or synopsis of test results. The consequent failure to record all test results represents a loss of valuable data which might have been used, for example, for statistical analyses of equipment reliability or making reports which are required by government agencies. Thus, if the company desires or requires such information, an additional service call may be needed to record the data which has already been obtained once.

An additional disadvantage of prior art systems is that the field representative's report must be manually correlated with "trouble ticket" information for the company to document that a customer complaint or report has been satisfactorily resolved. The manual correlation of "trouble tickets" with test results or other reports requires more time of the field representative and introduces another opportunity for error.

The above examples illustrate cases in which transfer of information regarding the service call into the administrative computer has required manual or human intervention. There are also instances of inefficiency resulting from transfer of information in the opposite direction, i.e., from the administrative computer to the field representative. For example, an administrative computer might contain information regarding the type of malfunction reported or the type of test which is required. In response to this information the field representative then manually configures test equipment to conduct the necessary tests. This configuration procedure requires additional time by the field representative and again represents an opportunity for introduction of error, particularly if the field representative misunderstands the type of tests which are needed.

Furthermore, some previous devices have a deficiency in that they fail to provide a number of desirable features. For example, many previous devices which permit communication to and from the administrative computer provide for communication only over physical media such as telephone lines, coaxial cable and the like. Many previous devices have little or no capacity for generating desirable test tones for placement onto telephone lines. Many previous devices have limited or no capability for graphics display and in particular cannot provide a graphics display that provides a time reference for a measurement. Many previous devices provided insufficient voltage or surge protection such as insufficient fusing or, when fusing was provided, failed to provide for simple and rapid replacement of blown fuses.

Accordingly, there is a need for an apparatus which does not require the intervention of the field representative or any other manual manipulation or input to conduct testing in accordance with information stored in the administrative computer, and does not require intervention to report the results of a service call for storage or processing by the administrative computer. There is further a need for an apparatus that provides additional capabilities such as independence from physical media for communication purposes, sufficient tone generation capacity, enhanced graphic capability, and simple and rapid fuse replacement.

SUMMARY OF THE INVENTION

The present invention includes a recognition of the problems and shortcomings of previous devices, such as those described above. According to the present invention, an administrative computer is coupled to testing equipment to enable test results to be automatically stored in the administrative computer, and automatically correlated with location information. The resulting system can automatically, or with only a small amount of user input, control the testing equipment to perform the desired tests.

In one embodiment, the administrative computer is able to establish communications, e.g., communications with another computer, without depending on the presence of physical media such as telephone lines or coaxial cable. In one embodiment, the administrative computer has a capability for communicating over wireless or radio frequency ("RF") networks. In one embodiment, the present invention provides a tone generator which can be used to apply any of a plurality of tones or tone combinations to, e.g., a telephone line for testing purposes. In one embodiment, the present invention can output or display information graphically in a line-graph format having time as one of the graph axes to provide a time reference for a continuous measurement. One embodiment of the invention includes fuse protection in which the fuses can be rapidly and quickly replaced. In one embodiment, a drawer is provided with two active fuses and two spare fuses. The active fuses may be replaced by the spare fuses by withdrawing the drawer, rotating the drawer 180° and reinserting the drawer.

In one embodiment, the administrative computer is a disk operating system ("DOS") -based computer.

In one preferred embodiment, the administrative computer and testing apparatus are embodied in a single hand-held unit. In this unit, an interface is provided between the administrative computer and the testing apparatus which allows administrative computer control of testing and/or automatic storage of test results, correlated with location information, while still maintaining the hand-held configuration. In one preferred embodiment, the administrative computer is coupled to the remainder of the equipment, yet electrically isolated therefrom to protect from excess voltages or other potentially damaging signals.

In one embodiment, the invention includes apparatus for permitting the user to obtain electrical tests results relating to equipment which is to be tested. The apparatus includes an administrative computer which is programmed to store and display information related to the location of the equipment which is to be tested, a keyboard for user input, and testing apparatus. The testing apparatus is configured to measure a plurality of electrical parameters to be tested. Data transfer apparatus is provided for transferring information based on the test data into the memory of the administrative computer without manual entry of the information via the keyboard. Preferably, the administrative computer controls testing apparatus to conduct certain tests. The computer, thus, may, at any given time, be running an administrative application program, a test program which controls the test interface device, or potentially, a program which integrates the administrative and test functions as described above.

According to another embodiment of the invention, apparatus is provided in connection with a hand-held administrative computer for testing equipment. The administrative computer has a CPU, memory, display, and keyboard. The apparatus receives signals from the equipment to be tested and introduces those signals to signal-conditioning equipment such as filters, then digitizes the information before conveying it to the administrative computer. In one embodiment, the data from the received signals is stored in a buffer memory in the administrative computer. The administrative computer reads data from the buffer memory and can combine and/or manipulate different test signals to obtain desired information regarding the equipment being tested. The results of the equipment testing are correlated with information stored in the computer, which relates to the location of the equipment to be tested.

In one embodiment of the invention, the testing equipment includes a plurality of relays which can selectively connect equipment test leads to signal conditioners such as filters. Under control of a stored program, the administrative computer can configure the relays to route the signals received from the test leads through various signal conditioners and to analog-to-digital converters before the resultant digital indications of test results are stored in the administrative computer memory.

The present invention also provides a system by which the administrative computer, in response to information stored in the administrative computer and/or in response to user input, can perform one or more pre-defined tests or series of tests. The system includes capabilities for a user to pre-define tests to be performed and/or measurements to be obtained in a manner consistent with tests and outputs of pre-defined procedures.

BRIEF DESCRIPTION OF THE DRAWINGS

FIG. 5 is a schematic block diagram of the filters and terminators of FIG. 4, according to one embodiment of the present invention;

FIG. 11A–11I depicts screen displays during various stages of operation of apparatus according to an embodiment of the present invention;

FIG. 14 is a top plan view of the administrative computer of FIG. 12, with the cover/display in the open position;

FIG. 23A is a perspective view, partially exploded of a fuse drawer used in connection with the slice circuitry of FIG. 13;

FIG. 23B is cross sectional view taken along line the 23b–23b of FIG. 23A;

FIG. 25 is a depiction of a screen display of a time-based measurement according to an embodiment of the present invention.

DETAILED DESCRIPTION OF THE PREFERRED EMBODIMENTS

The present invention includes an administrative computer and apparatus for obtaining electrical test results. According to one embodiment, as depicted, for example in FIGS. 12–24, the administrative computer is a portable administrative computer which includes a computer processing unit (CPU), a memory, a keyboard for input, a display for output, and a portable power source. The administrative computer may be programmed (such as by downloading from a central computer) to store information relating to the service call, including the location of the equipment, the customer name and other customer information, trouble ticket number, the nature of the problem reported, scheduling, and other dispatching or "administrative" information. The administrative computer can also store telephone numbers such as remote computer numbers for modem connections, telephone company test numbers and the like. The administrative computer is preferably, powered by rechargeable batteries.

In one embodiment, the administrative computer is a hand-held administrative computer Model T5000, sold by Itronix, Inc., Spokane, Wash. The T5000 is a microprocessor-based computer provided with random access memory (RAM) and powered by a rechargeable battery. The CPU is preferably model 80C88 produced by Intel, Inc. The T5000 includes a keyboard and an LCD display. The T5000 also includes several serial ports and a modem.

Figure 12:
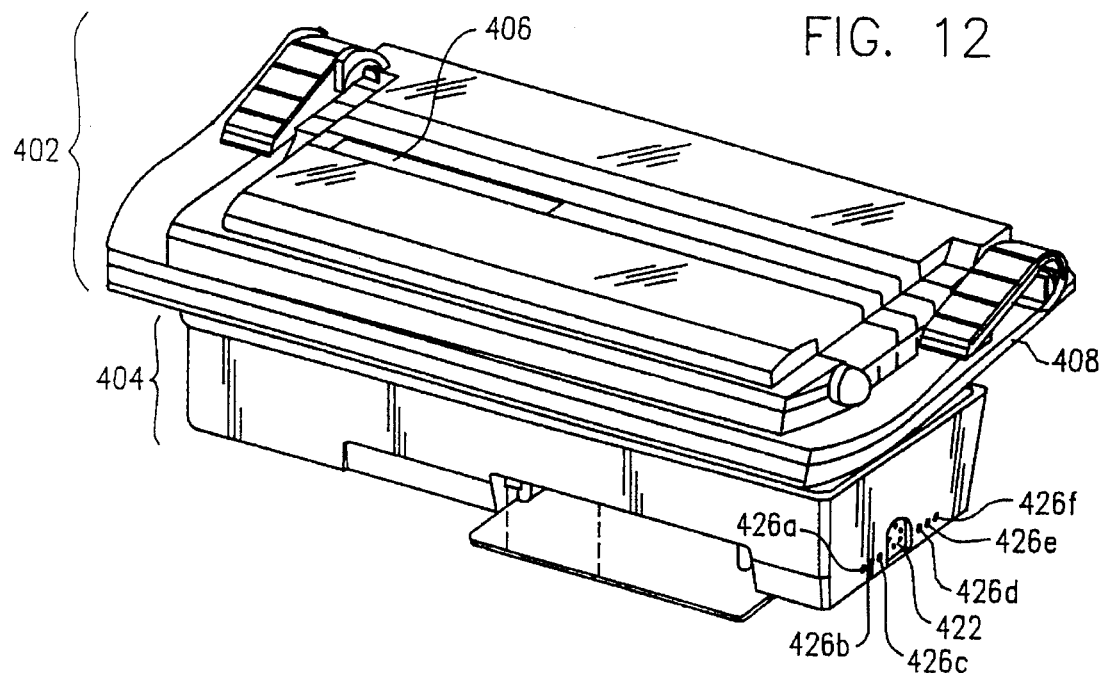
FIG. 12 is a perspective view of an administrative computer.

FIG. 12 depicts the external appearance of one model of the T5000. The T5000 includes two matable components, namely an upper case portion 402 and a lower case portion 404. The upper case portion 402 includes a display/cover assembly 406 pivotally connected to a housing-keyboard assembly 408 with a cable 409 (FIG. 24) for communication. FIG. 14 shows the T5000 with the cover/display assembly pivoted to an open position to expose a display 410, a keyboard 412 and a speaker 414. The T5000 has, in general, a "laptop" design which allows the screen to be closed over the keyboard when it is not being used. In the depicted embodiment, the screen 410 is a liquid crystal display (LCD) screen with a capability of 640 characters in a 16-line by 40-character format (128×240 pixels in graphics mode). The speaker 414 provides volume-adjustable audible monitoring of a connected phone line. The keyboard is an environmentally sealed keyboard that has 74 keys which allow the operator access to system functions.

Figure 15:
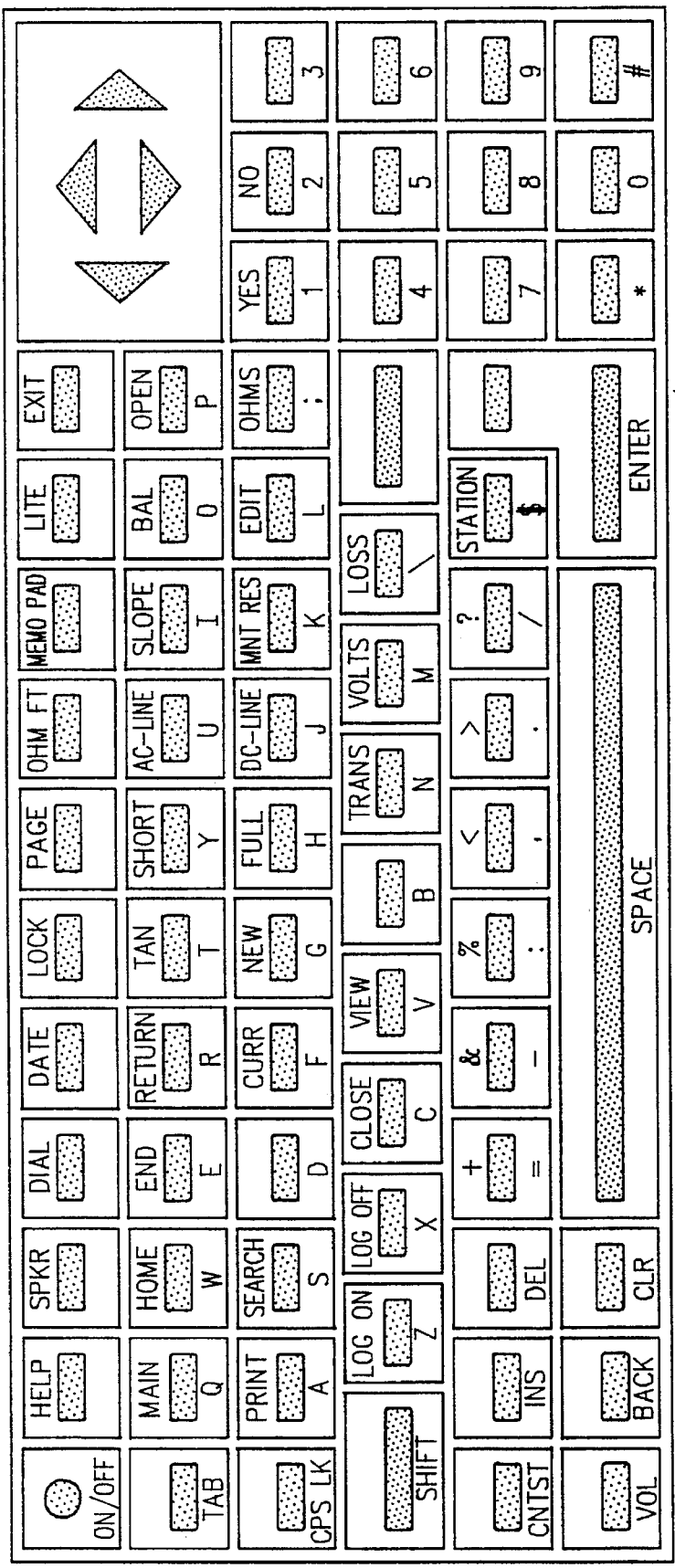
FIG. 15 is a top plan view of a keyboard which can be used in connection with the administrative computer depicted in FIG. 12.

FIG. 15 shows the keyboard of the T5000. The keyboard 412 operates in a fashion similar to that of a computer terminal with normal and shifted keys. Most of the keys depicted in FIG. 15 have two labels with the lower one representing the unshifted meaning and the upper one representing the shifted meaning. Table I provides a description of the operation of a number of the keys. The depicted keyboard layout is a sample of one possible configuration for a keyboard and other keyboard configurations can also be provided. A particular "on-line" use of the T5000 is as a terminal to display technician access network (TAN) information and a number of TAN-related keys are listed in Table I. TAN is a network developed by Bell Communications Research which provides technicians in the field with access to the Loop Maintenance Operations System (LMOS). In this way, technicians can receive, return and close out data for service calls (trouble-tickets) and gain access to the Mechanized Loop Testing (MLT) function. The T5000 computer can function as a terminal to display the TAN menus and allows the menu to input data into the TAN system. TAN accepts and formats data into a LMOS screen that is transmitted to the LMOS front-end.

TABLE I

KEY DEFINITIONS

| Key | Description |
| --- | --- |
| DIAL | Displays the Dial screen. |
| HELP | Displays Flash menu screen. |
| CPS LCK | Toggles the alpha characters between the upper and lower case. |
| TAB | Functions as a forward tab on data entry screens. |
| PAGE | Activates Page mode to allow viewing of areas of the screen outside the physical window. Only the arrow keys may be used in Page mode. Press [PAGE] to exit Page mode. |
| ON/OFF | Powers the T5000 computer on or off. |
| DATE | Display the current date and time. |
| LIGHT | Turns on/off the backlight for the screen. |
| LOCK | Locks the T5000 computer. |
| OHMFT | Displays the convert Ohms to Feet screen. |
| MEMO PAD | Displays the Scratch Pad screen. |
| SPKR | Displays the Speaker Mode screen. |
| MAIN | Displays the T5000 Main Menu screen. |
| TAN | Displays the TAN Main Menu offline, online sends a *1 [ENTER] to TAN. |
| VIEW | Allows the operator to view previously received data. |
| PRINT | Displays the Print Data Menu screen. |
| SEARCH | Displays the Search Options Menu. |
| (Z) LOG ON | Sends a *5 [ENTER] to TAN in online mode. |
| (X) LOG OFF | Sends a *0 [ENTER] to TAN in online mode. |
| (G) NEW | Sends a *1 [ENTER] to TAN in online mode. |

TABLE I-continued
KEY DEFINITIONS

| Key | Description |
| --- | --- |
| (F) CURR | Sends a *2 [ENTER] to TAN in online mode. |
| (R) RETURN | Sends a *3 [ENTER] to TAN in online mode. |
| (C) CLOSE | Sends a *4 [ENTER] to TAN in online mode. |
| (Y) SHORT | Sends a *5 [ENTER] to TAN in online mode. |
| (H) FULL | Sends a *6 [ENTER] to TAN in online mode. |
| (W) HOME | In View Data mode, moves the display window to the first line of text in the current session. |
| (E) END | In View Data mode, moves the display window to the last line of text in the current session. |
| * | Generates an asterisk in online mode. |
| # | Generates a pound sign in online mode. |
| YES | Sends a one [ENTER] to TAN in online mode. |
| NO | Sends a two [ENTER] to TAN in online mode. |
| BACK | Returns to the previous screen without saving data. |
| CLR | Clears the field the cursor is positioned on. |
| CNTRST | When followed by [↑] or [↓] increases or decreases the contrast of the display. |
| DEL | Deletes the character the cursor is on. |
| ENTER | Saves data into the T5000 TeleTester computer. In Review mode, displays the next dispatch screen. |
| EXIT | Requests the communication connection be terminated. |
| INS | Allows characters to be inserted. |
| SHIFT | Turns Shift mode on/off. |
| SPACE | Inserts a space where the cursor is located. |
| VOLUME | When followed by [↑] or [↓] increases or decreases the beeper, keyclick and speaker volume. |
| [→] | Moves the cursor one character to the right within a field. |
| [↓] | Online: Positions the cursor for menu selections. While in Review or Help mode, displays the next T5000 TeleTester computer screen (which represents three system screens). Offline: Enters data into the handheld computer and returns to the next field. |
| [←] | Moves the cursor one character to the left within a field. |
| [↑] | Online: Positions the cursor for menu selections. While in Review or Help mode, displays the previous T5000 TeleTester computer screen (which represents three system screens). Offline: Enters data into the handheld computer and returns to the previous field. |
| LIGHT | Turns on the backlight for the screen (this function is available only when the backlight hardware is installed in the T5000 TeleTester computer). |
| SPKR | Displays the Speaker Mode screen. |
| BAL | Displays the Circuit Balance screen. |
| CUSTOM | Displays the Custom Test menu. |
| EDIT | Displays the Edit Parameters screen. |
| LOSS | Displays the Circuit Loss screen. |
| MAINT | Displays the Maintain Results screen. |
| OHMS | Displays the Ohms Test screen. |
| OPEN | Displays the Opens Test screen. |
| VOLTS | Displays the Volts Test screen. |
| AC-LINE | Displays the AC Line Test screen. |
| DC-LINE | Displays the DC Line Test screen. |
| SLOPE | Displays the Slope Test screen. |
| TRANS | Displays the Loop Transmission Test screen. |
| STATION | Displays the Station Test screen. |

Figure 16:
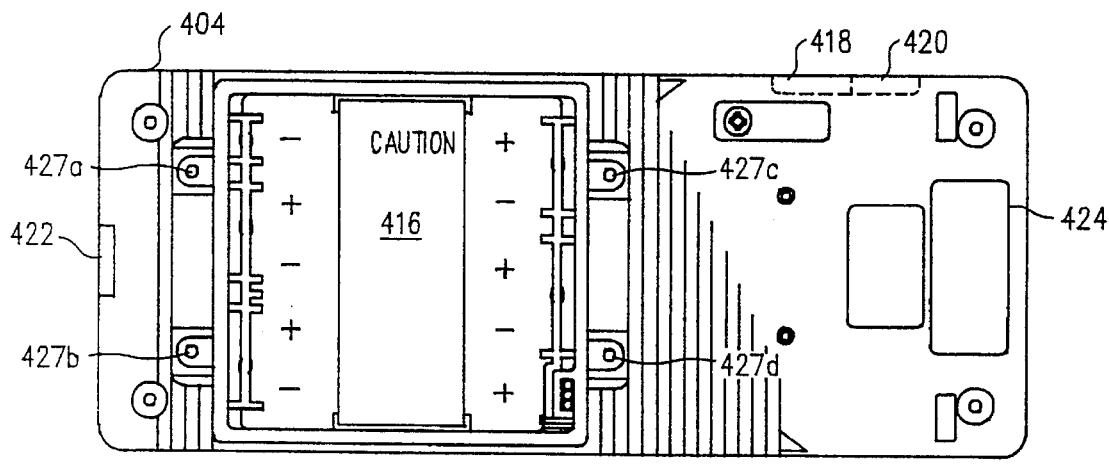
FIG. 16 is a bottom plan view of the bottom portion of the administrative computer of FIG. 12.

The lower portion 404 (FIG. 12) includes a number of electronic components, described more fully below, and also provides power, modem and cradle functions. FIG. 16 shows the bottom surface of the lower portion 404. The lower portion 404 includes apparatus for power functions by including a battery compartment 416 which contains rechargeable nickel cadmium (NiCad) battery pack to provide the primary power for the T5000 computer. Quick-release battery contacts 427a–427d are positioned on the bottom surface. The power function is also implemented by a power port 418. The power port 418 includes a connector for connecting to battery charger which derives power from an AC current source (such as an ordinary wall socket) for charging and/or cycling the battery pack. Cycling the NiCad batteries maintains their capacity. Communication functions are implemented by devices including a number of communication ports. A first communication port 420 can be used for modem communication. A serial port 422 can be used for e.g., RS-232 serial communications, bar code coupling to a input coupling to a printer or to another computer (such as a PC), or other purposes. A module connector 424 can be used for connection to special purpose, custom modules. Cradle contacts 426a–426f (FIG. 12) mate with contacts on a cradle unit to allow battery recharging and communication functions. Cradles (not shown) can be provided as modular, support hardware which recharge batteries and provide a communication path, e.g. to a host computer.

Figure 17:
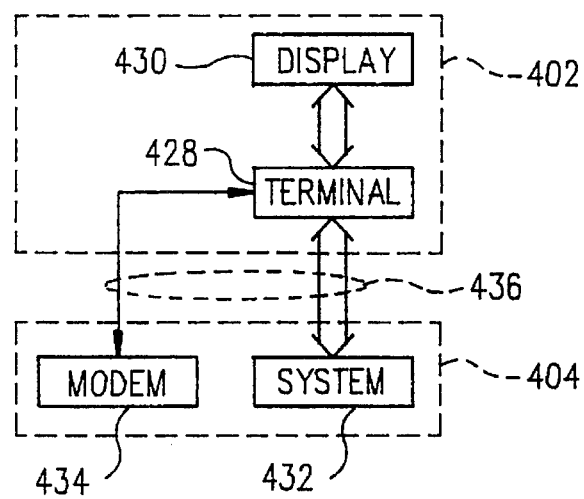
FIG. 17 is a block diagram of the apparatus of FIG. 12.

FIG. 17 depicts the main functional components of the T5000. The upper portion 402 is, in general terms, provided on two circuit boards, a terminal board 428 and a display board 430. The terminal board 428 resides in the keyboard/housing portion 408 and the display board 430 resides in the display/cover portion 406. The terminal board 428 contains circuitry for recognizing and buffering keystrokes, for driving the speaker 414 and for transmitting and receiving data to and from the display 430 and the lower portion 404. The display board 430 contains circuitry for driving the LCD display. The lower portion 404 contains a system board 432 which contains a microprocessor, memory circuits, and other circuitry commonly provided in a DOS-based computer system well-known to those of skill in the art. The modem board 434 contains circuitry for receiving and transmitting digital signals and for modulating and demodulating these signals into an audio frequency signal, for transmission, e.g., onto telephone lines. The connections 436 between upper portion 402 and lower portion 404 can be by way of a plurality of connections such as individual wires or cable or a multi-wire "ribbon" connector.

The upper portion 402 and lower portion 404 are physically coupled to one another to provide a single rigid unit as depicted in FIG. 12. The upper portion 402 and lower portion 404 are provided with devices to effect the rigid connection such as inter-connecting tabs and slots and threaded bolts. Other devices can also be to connect the upper and lower portions 402, 404, such as latches, clips, straps and the like. In the depicted embodiment the upper and lower portions 402, 404 are releasably connected so that the lower portion and upper portion 404, 402 can be detached from one another and moved apart. An advantage of providing the administrative computer in a configuration which permits the upper and lower portions to be detached is that such detachment accommodates inserting other circuitry physically between the upper and lower portions.

Figure 13:
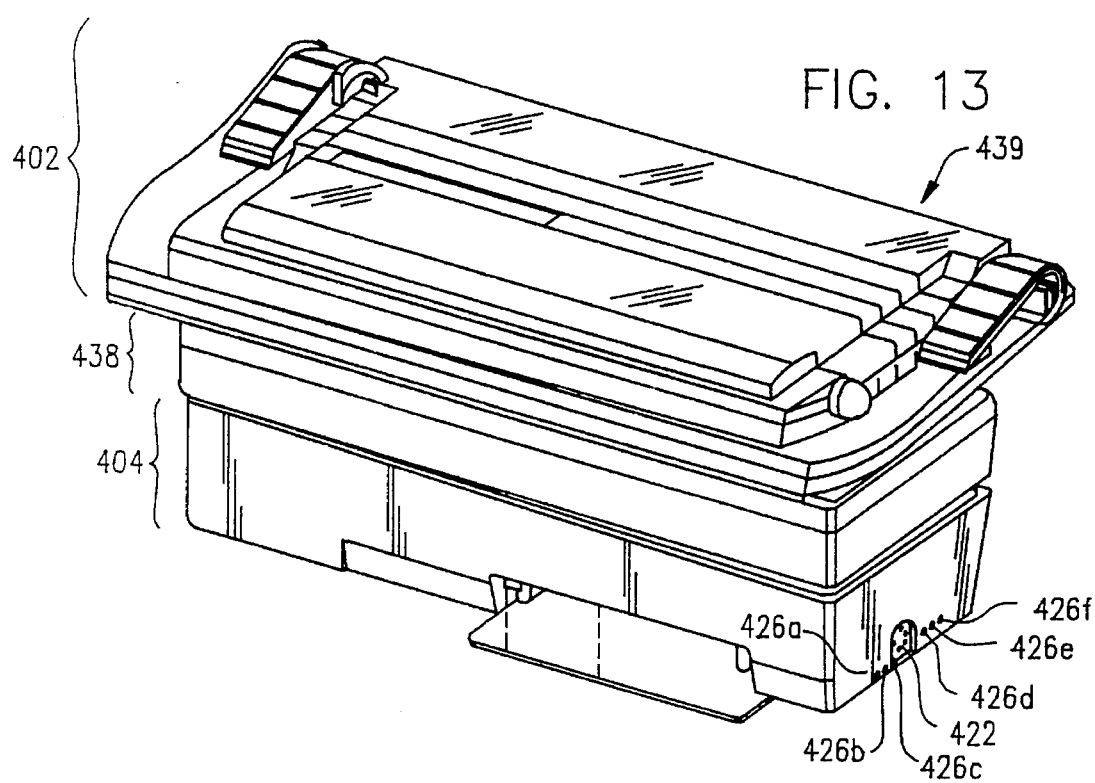
FIG. 13 is a perspective view of administrative computer with a testing slice circuit coupled thereto, according to an embodiment of the present invention.

FIG. 13 depicts an apparatus in which testing circuitry 438 is inserted in a "slice" fashion between the upper portion 402 and lower portion 404. Accommodating the slice 438 between the upper portion 402 and the lower portion 404 permits the addition of circuitry without sacrificing access to a bottom or side exterior surface of the lower portion 404 which, as described above, will typically contain devices to which access should remain available, such as the battery pack 414 and ports 420, 422 and 424. Furthermore, such positioning of the slice 438 avoids any interference with the mating of the lower portion 404 to a cradle device.

In one embodiment, the slice 438 contains circuitry and devices to facilitate testing, maintaining or installing telephone lines or equipment. In one embodiment, the slice is particularly configured to support troubleshooting tests of two-wire switched, analog telephone lines from the far end. In this embodiment, the test apparatus 439 operates as a special-purpose multi-meter. It comes equipped with a number of standard tests designed for analog telephone line testing. The device 439 can also be operated as a tone source. The device is able to send tones as predetermined levels and frequencies. In one embodiment, tones can be selected from among 404 Hz, 1004 Hz and 2804 Hz. Additionally, a locate tone of 577 Hz can be generated. Further, options are provided for generating a sequence of tones that can go up or down in order of frequency and the operator can select between a continuous output or a pulse output of the tone. The operator can select the duration of single tones step tones in a sequence, can determine the inter-tone delay and the number of times a step tone sequence or single tone is repeated. The device 439 includes software providing the ability to program standard tests as well as to customize tests and test sequences, e.g., to implement company standards, thresholds and prompts using internal terminology.

Figure 18:
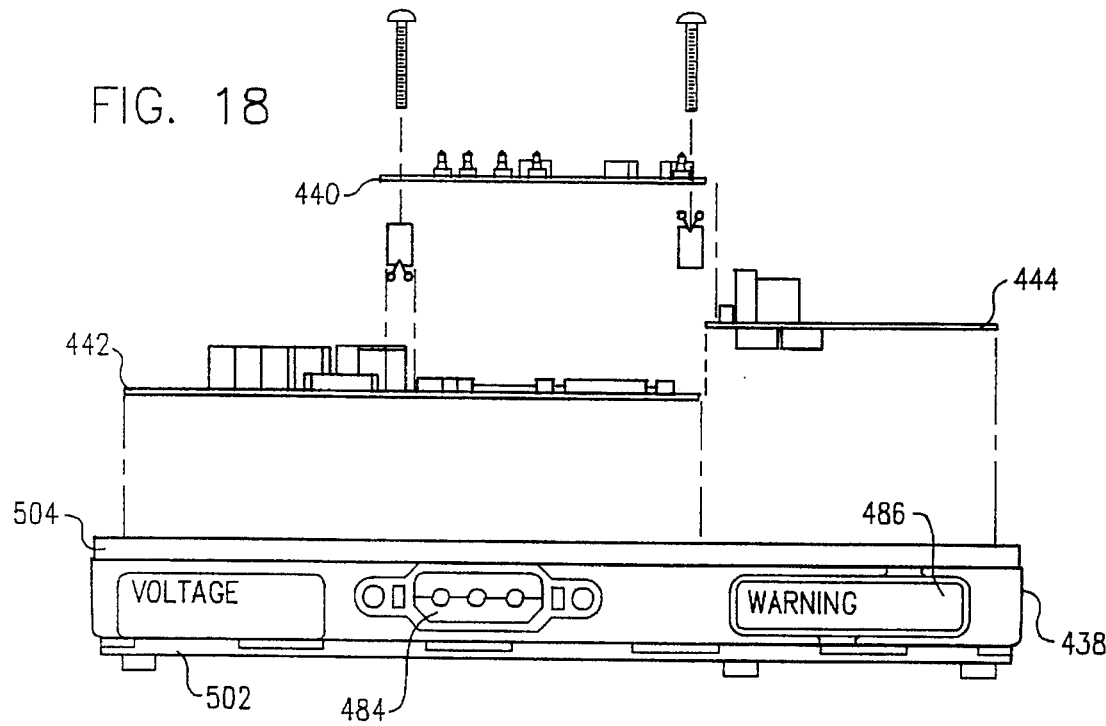
FIG. 18 is a rear elevational view of the slice component of FIG. 13, partially exploded.

FIG. 18 shows an exploded side view of the slice 438. As seen in FIG. 18, the slice 438 includes three main circuit boards; a digital board 440, an analog board 442, and an interface board 444. The digital board 440 provides interfacing to the administrative computer, including control of communication links. The analog board 442 houses the analog circuitry necessary for performance of the tests, and includes analog-to-digital converters, to allow the slice 438 to communicate with the administrative computer. The interface board contains the power supply for the slice 438 and contains a tone generator for outputting selected tones for testing purposes.

Figure 19A:
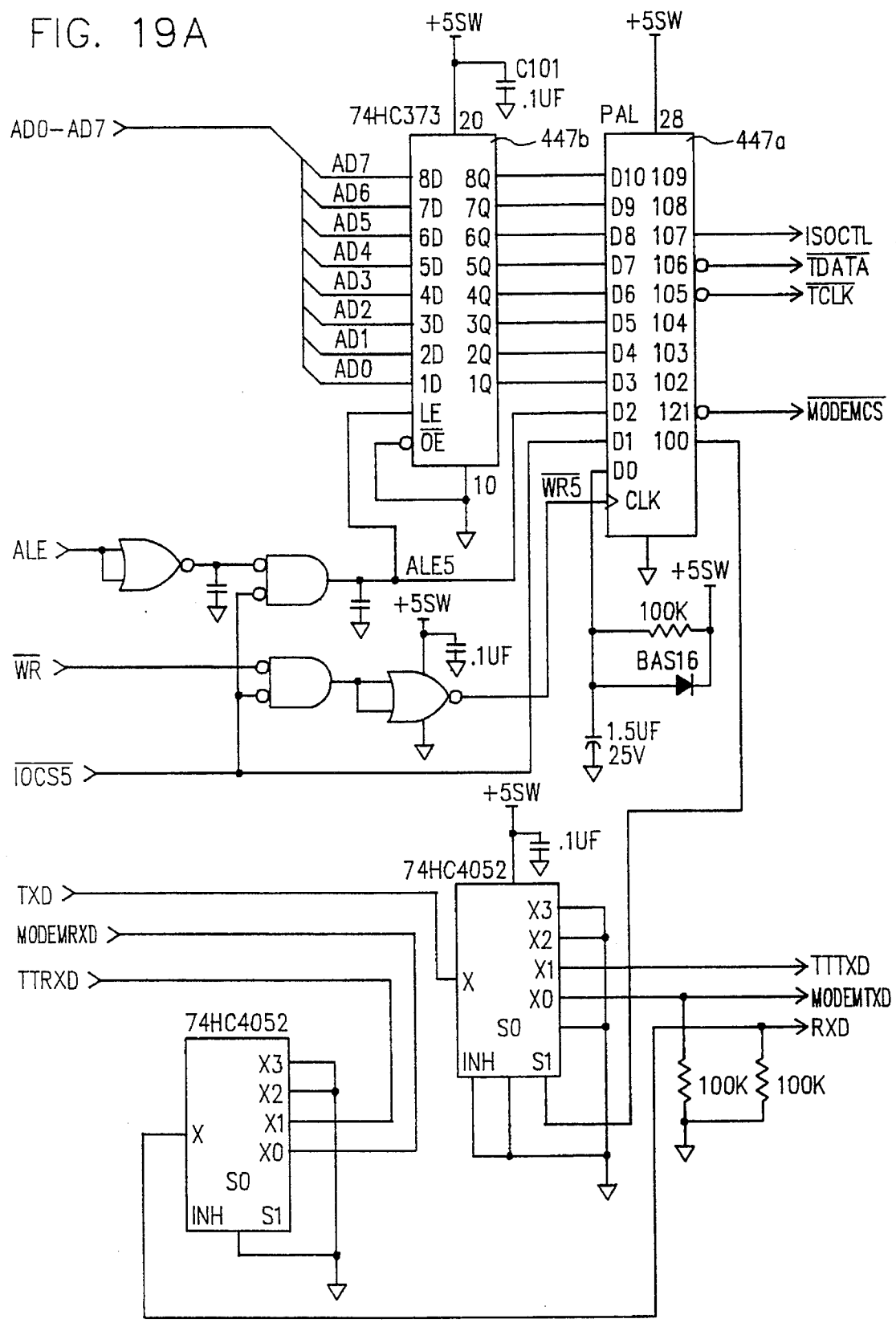
FIGS. 19A–19D are schematics of electronics provided in the digital board of the device of FIG. 18.
Figure 19B:
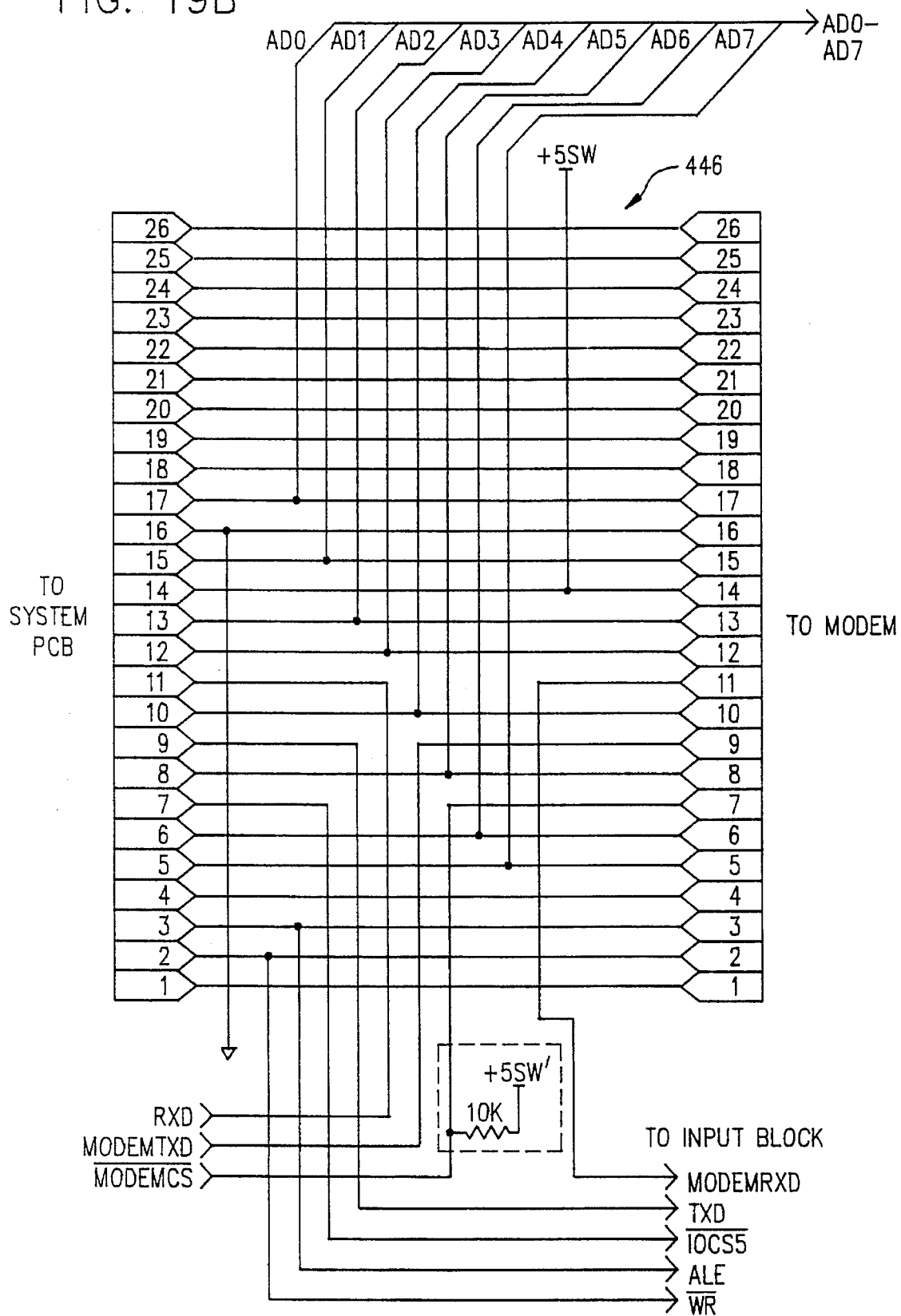

As seen in FIG. 19, the digital board 440 includes a dual-port connector 446 with one port providing connection to the system board 432 and the other port providing connection to the modem board 434. These connections are depicted in block form, in FIG. 20. An address decoder 447a decodes addresses from an address latch 447b and provides control signals to the slice. The address latch 447b qualifies the addresses to the address decoder 447a so that the address decoder can be shielded from unnecessary input.

Figure 21A:
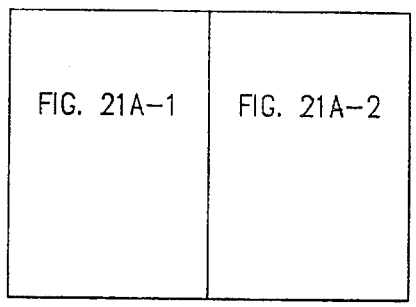
FIGS. 21A–21E are schematic diagrams of the analog board of FIG. 18.
Figure 21D:
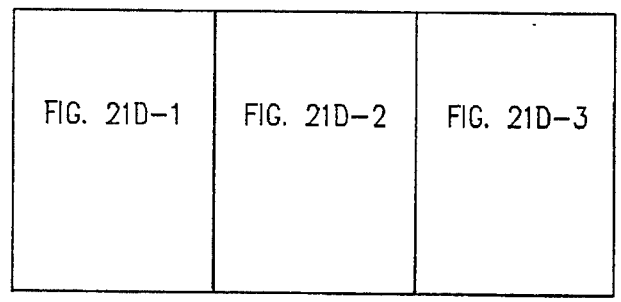
Figure 21E:
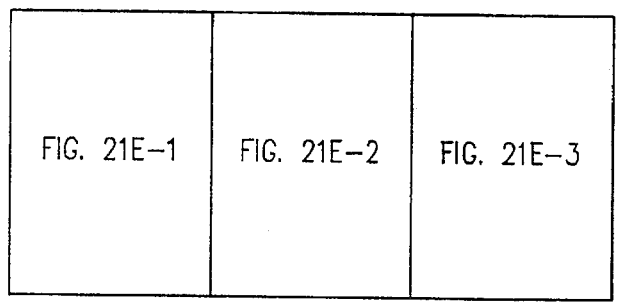
Figures 1, 21A:
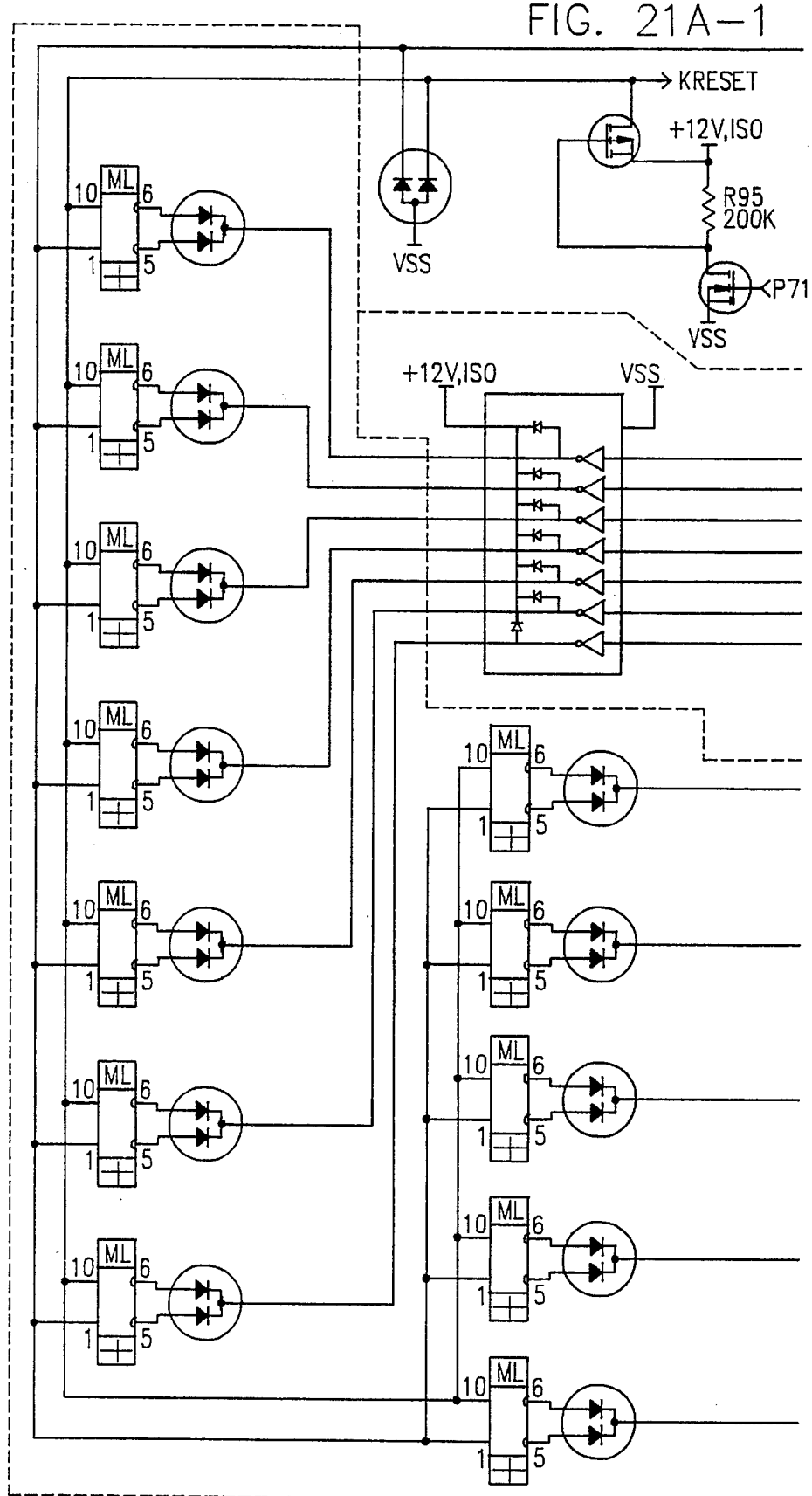
Figures 2, 21A:
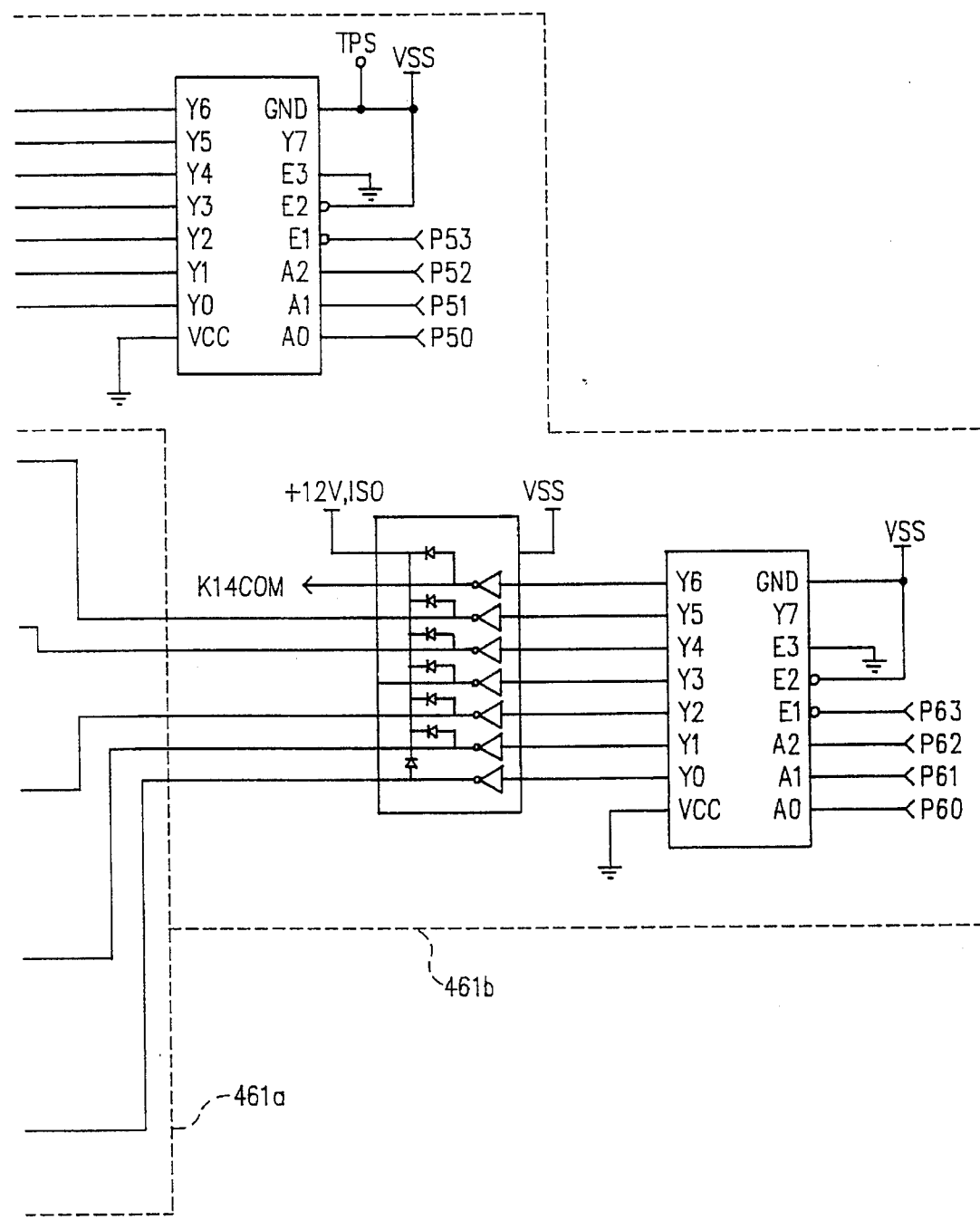
Figure 21B:
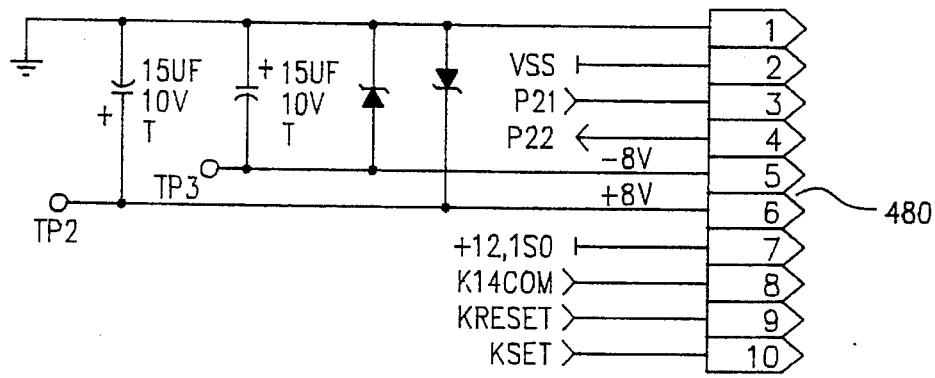
Figure 22D:
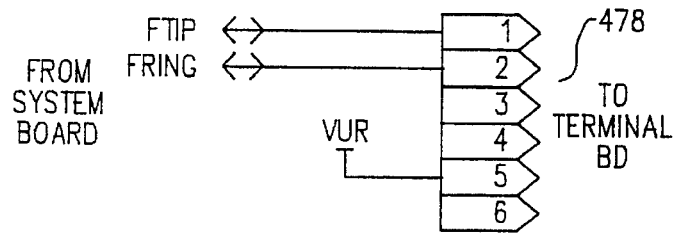
Figure 22E:
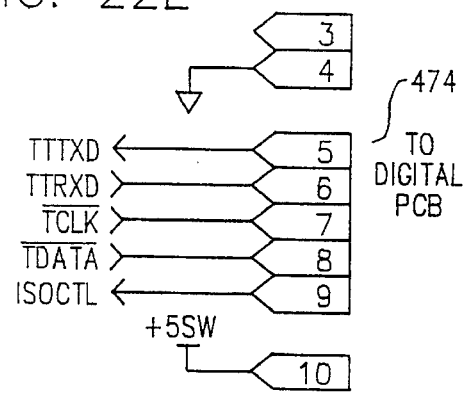
Figure 22F:
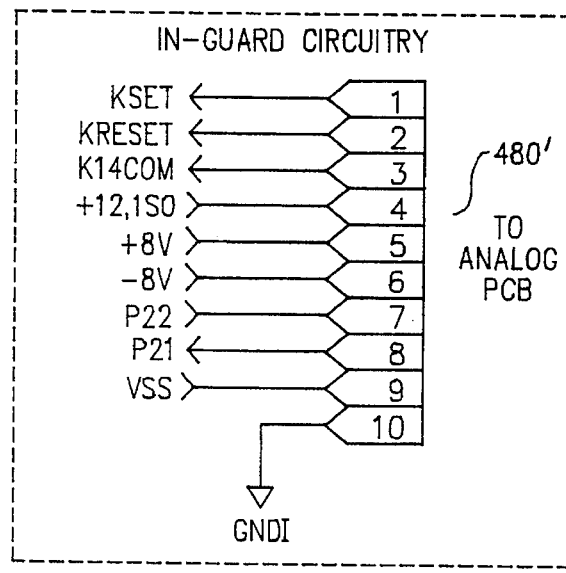
Figure 21C:
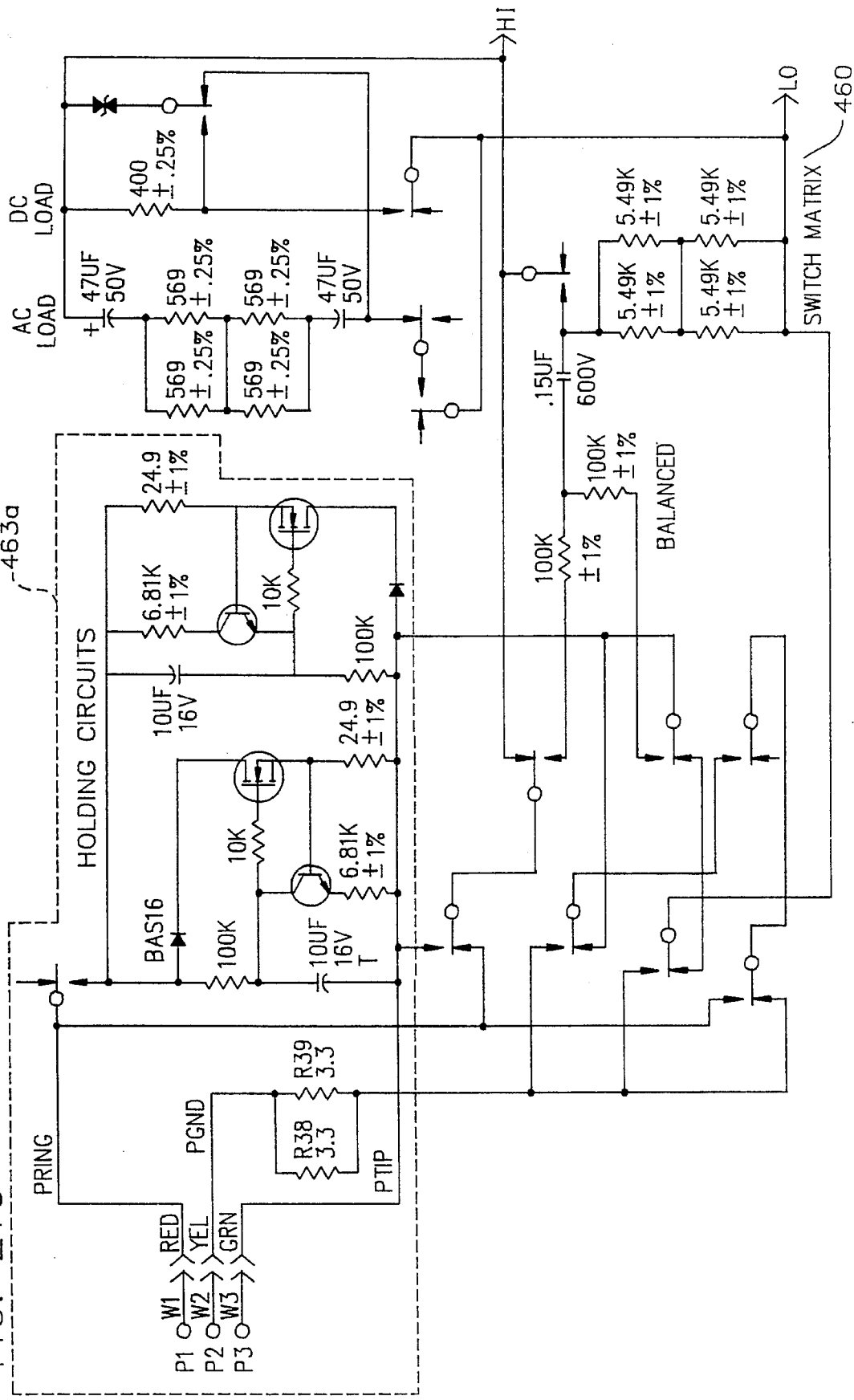
Figures 1, 21D:
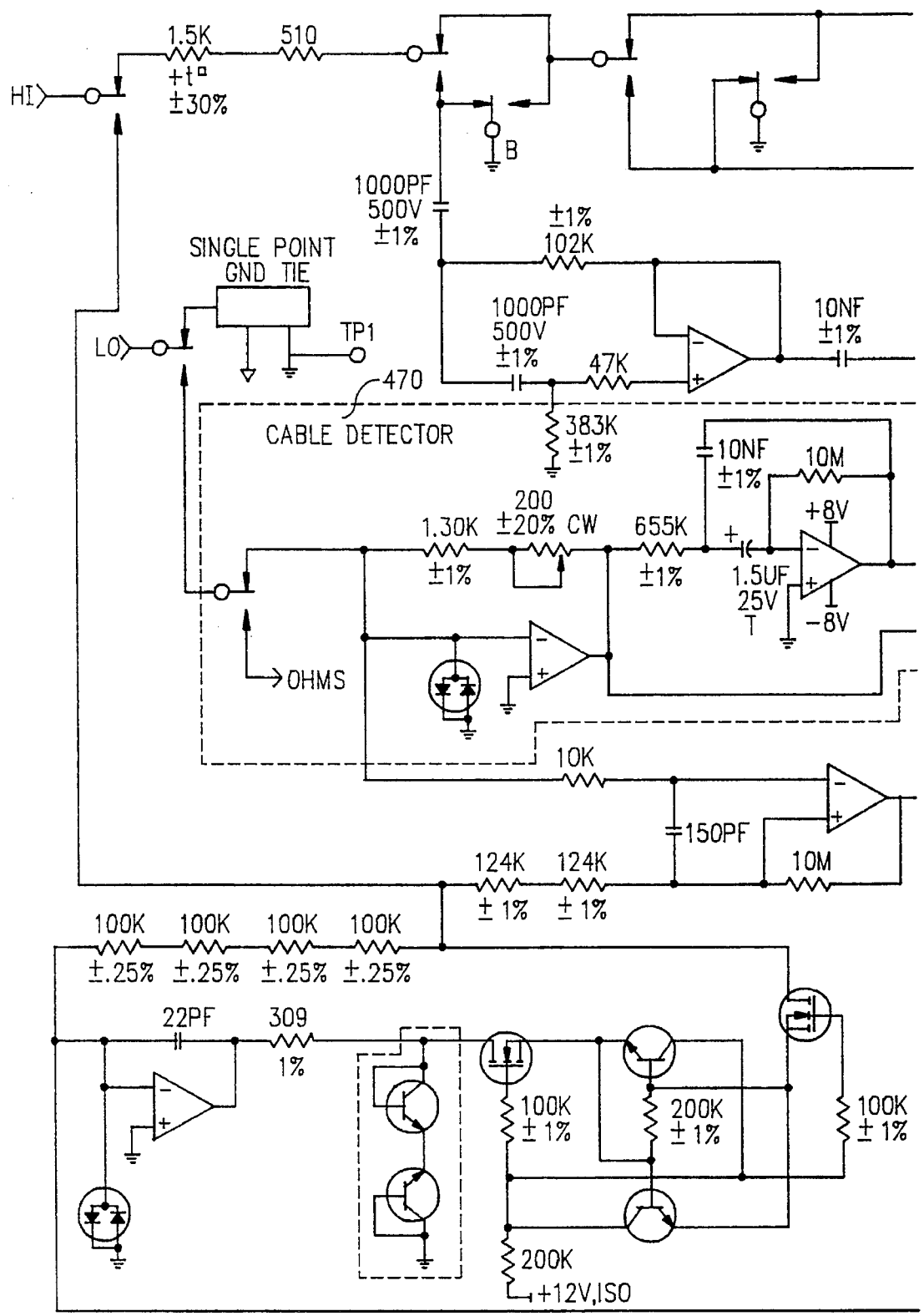
Figures 2, 21D:
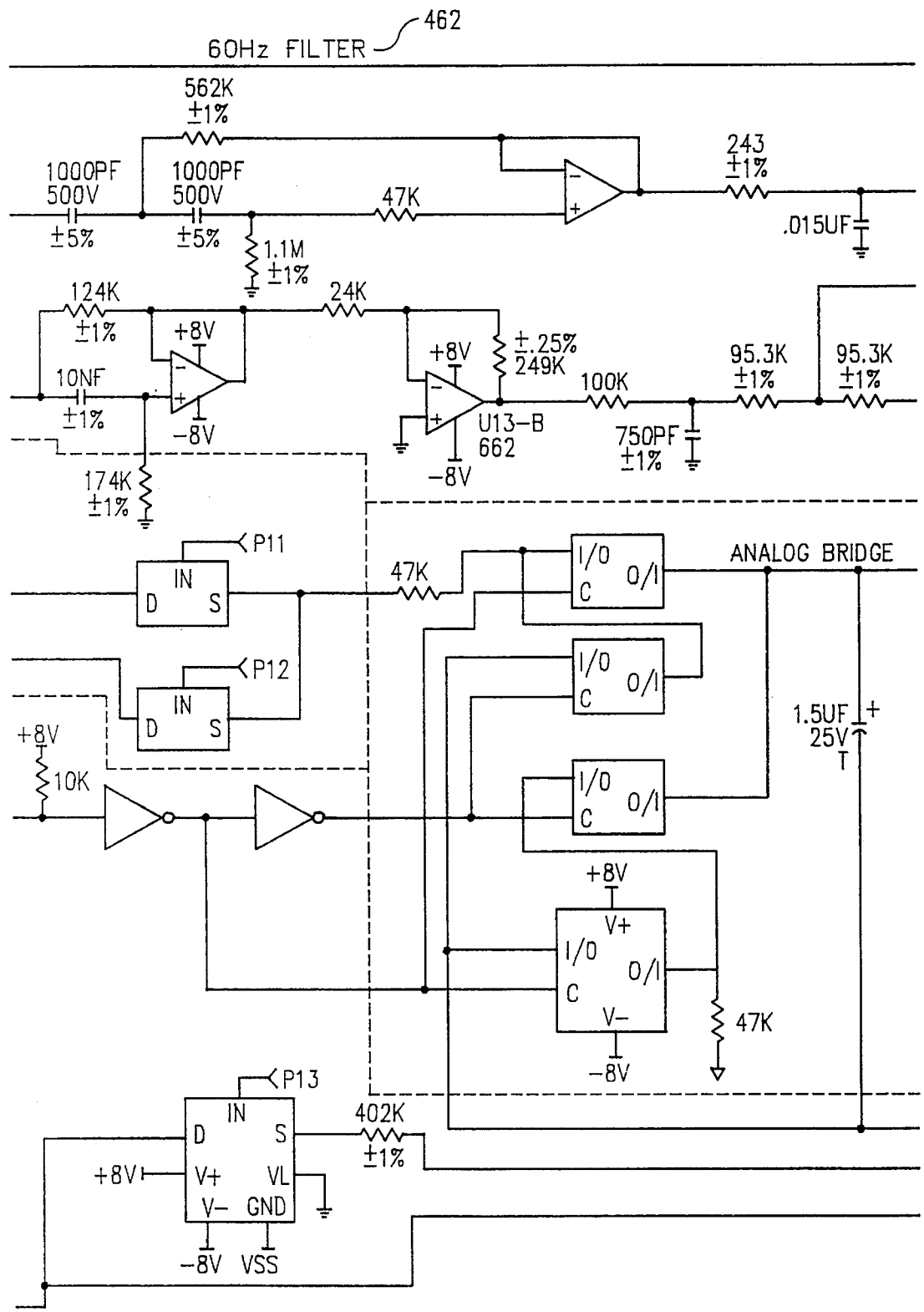

FIGS. 21A through 21C depict components of the analog board 442. In one embodiment, signals received from the equipment to be tested can be processed by a number of filters. Switches in a matrix 460 can be used to select signal conditioning circuits. The switch matrix 460 selects various terminations as well as combinations of test leads. The switch matrix is controlled by a relay matrix 461a, controlled by relay drivers 461b which take input from the controller 472. The controller 472 contains both analog and digital circuitry as well as a four-bit microcomputer. This chip controls the relay driver analog switches and provides for communication with the T5000. An example of a controller which can be used in this way is Model SMX available from John Fluke Manufacturing, Seattle, Wash.. In the depicted embodiment, a number of filters can be provided including a 60 Hz high-pass filter 462 and a C-weighted filter 464, which can be provided, e.g., in accordance with IEEE Standard 743-1984106. A holding circuit 463a contains two idential circuits, one for each polarity. This circuit establishes a DC current path while providing a high AC impedance. A cable detector 470 is used to determine the capacitance and conductance of a cable. A cable oscillator provides a 24 Hz sine wave used in determination of cable capacitance. An analog bridge 469a acts as a phase detector to assist in determining the capacitance of a cable. An RMS converter 469b converts an AC signal to a DC signal. Voltage and Ohm signal conditioning 466 provides +1 and −1 volts used to perform Ohm measurements.

Figure 22A:
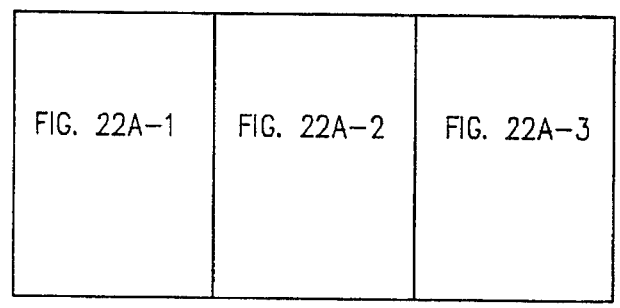
FIGS. 22A–22F are schematic diagrams of the inter face board of FIG. 18.
Figure 22B:
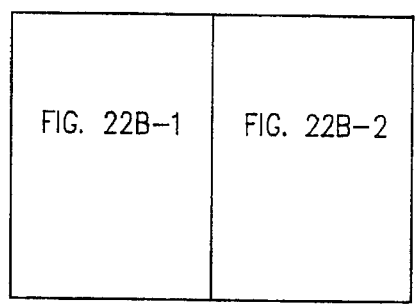
Figures 1, 22A:
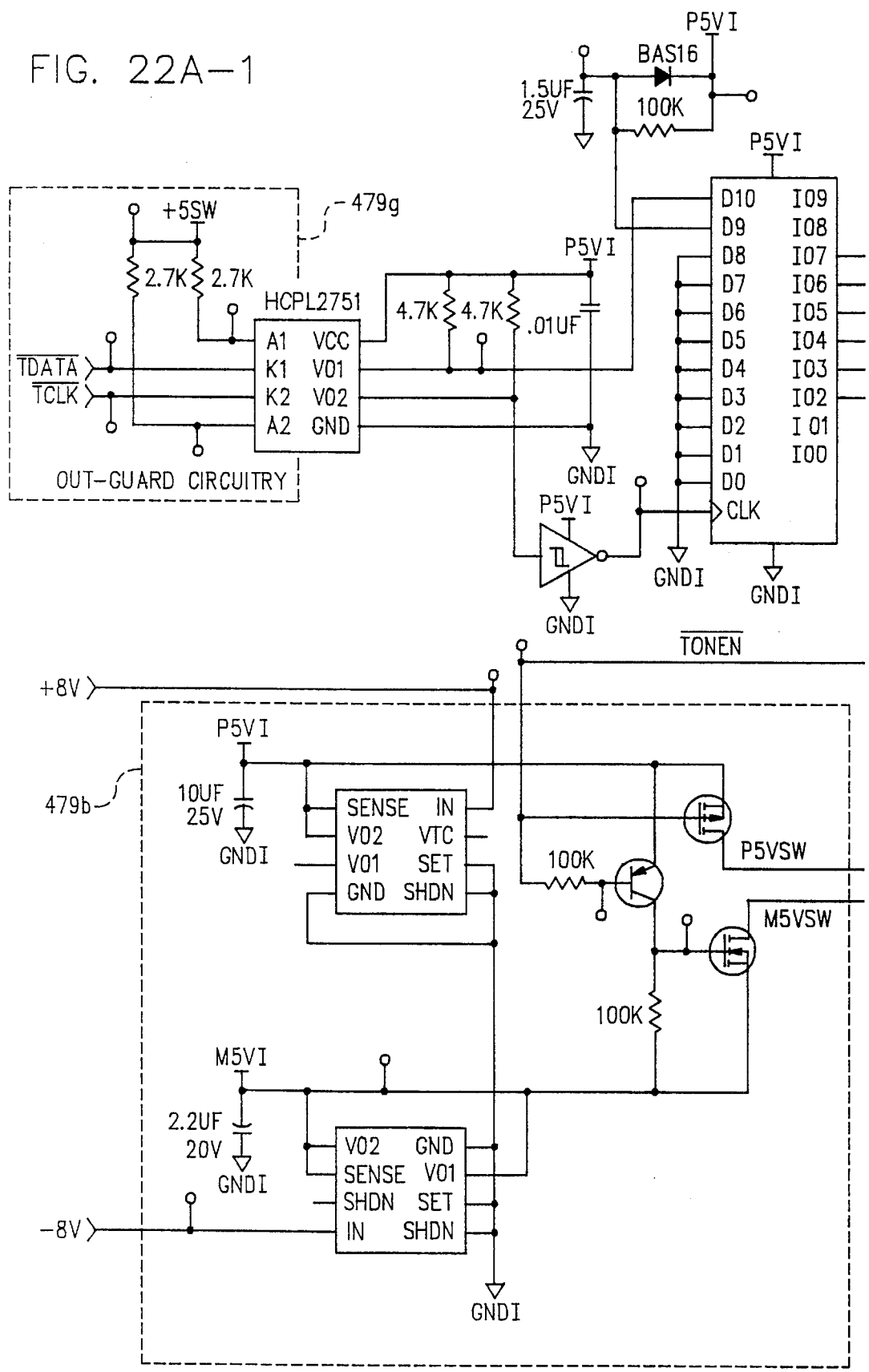
Figures 2, 22A:
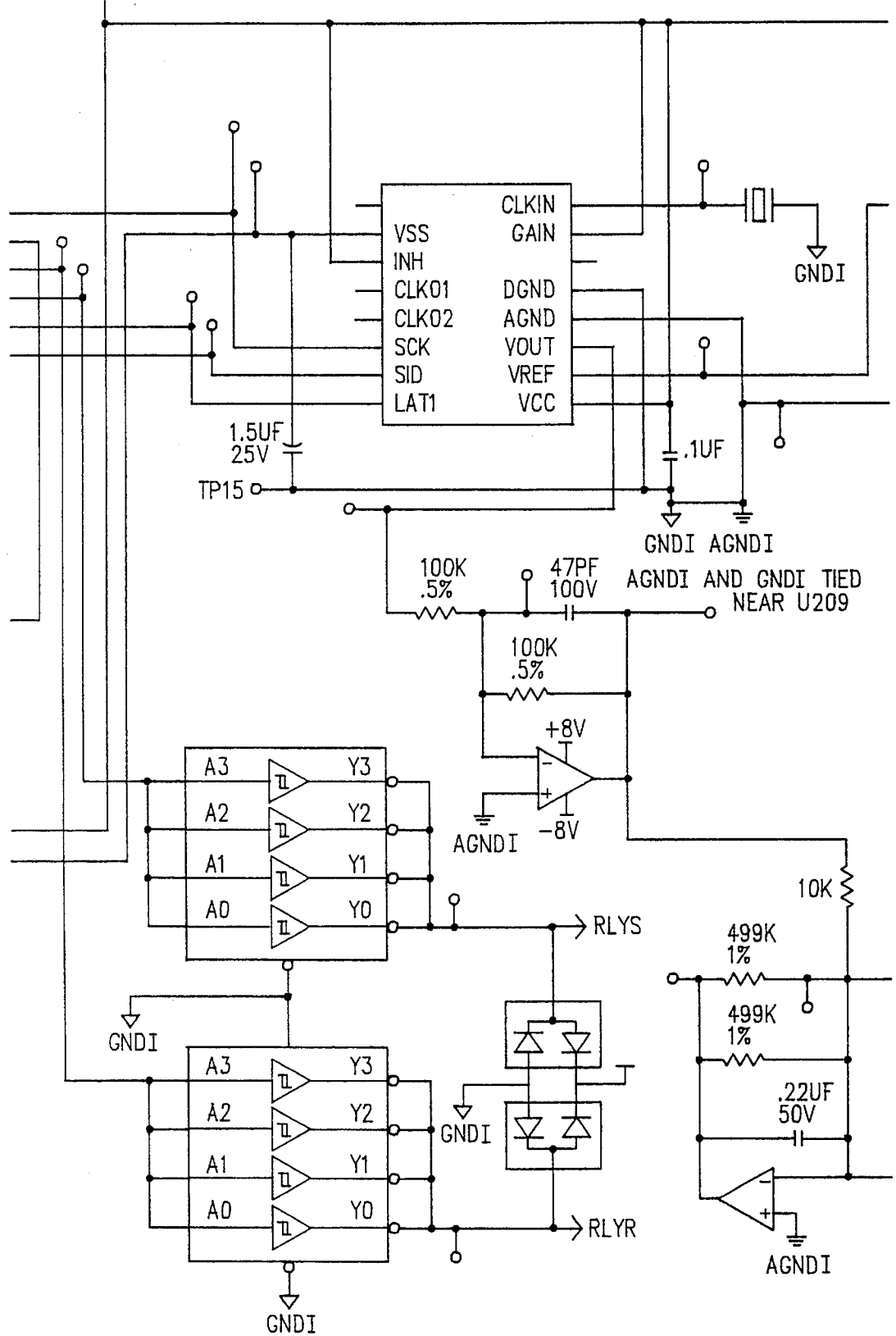
Figure 22A:
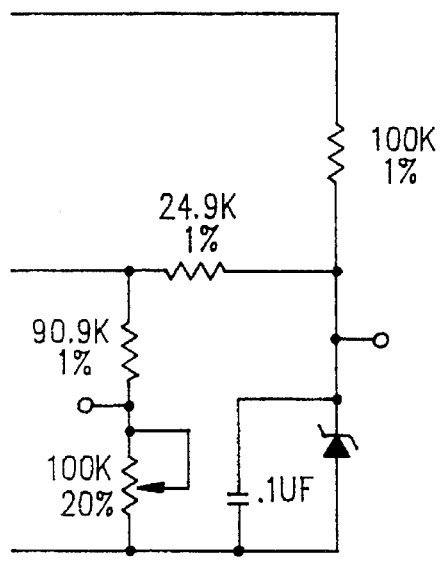
Figures 1, 22B:
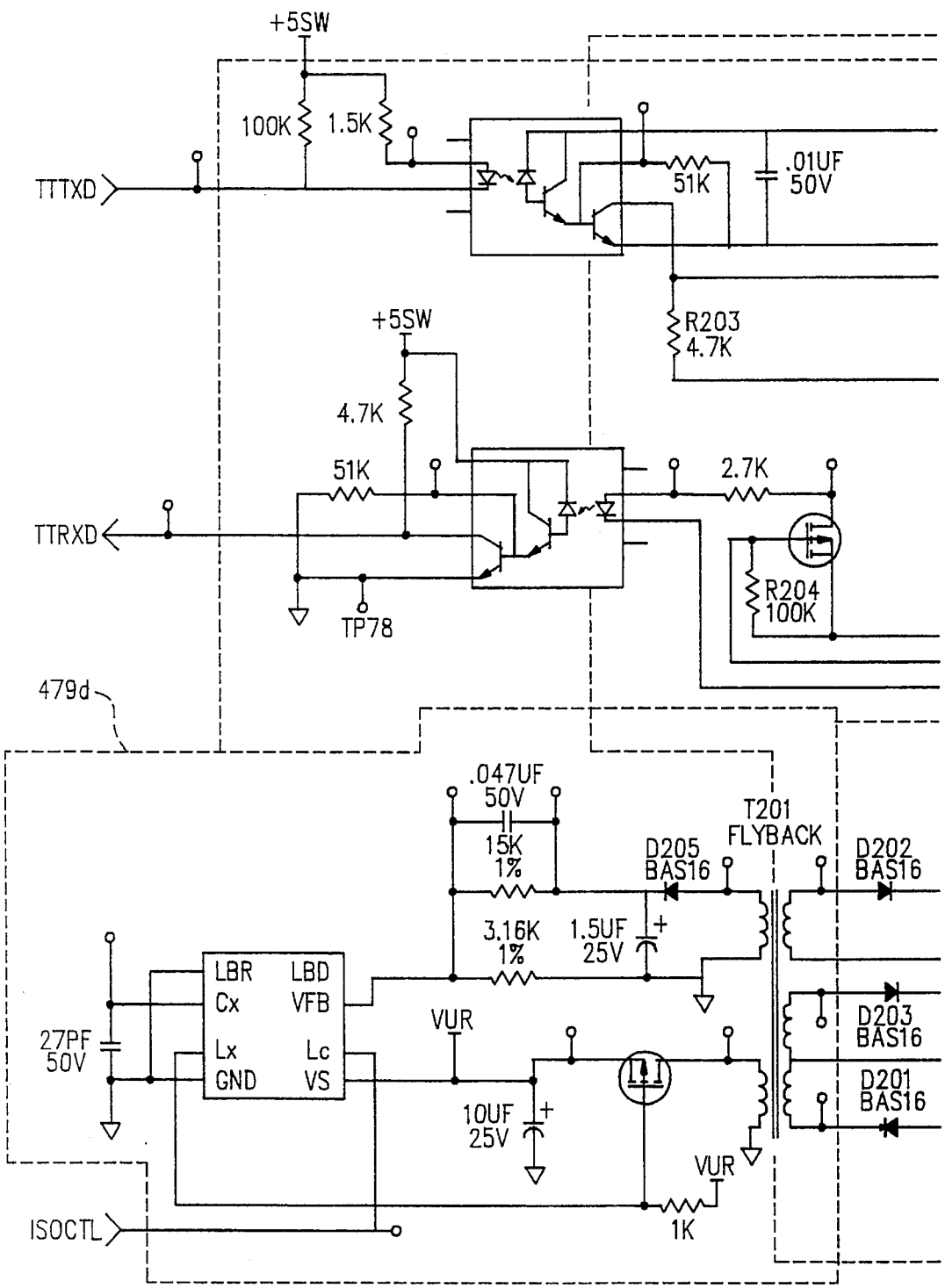
Figures 2, 22B:
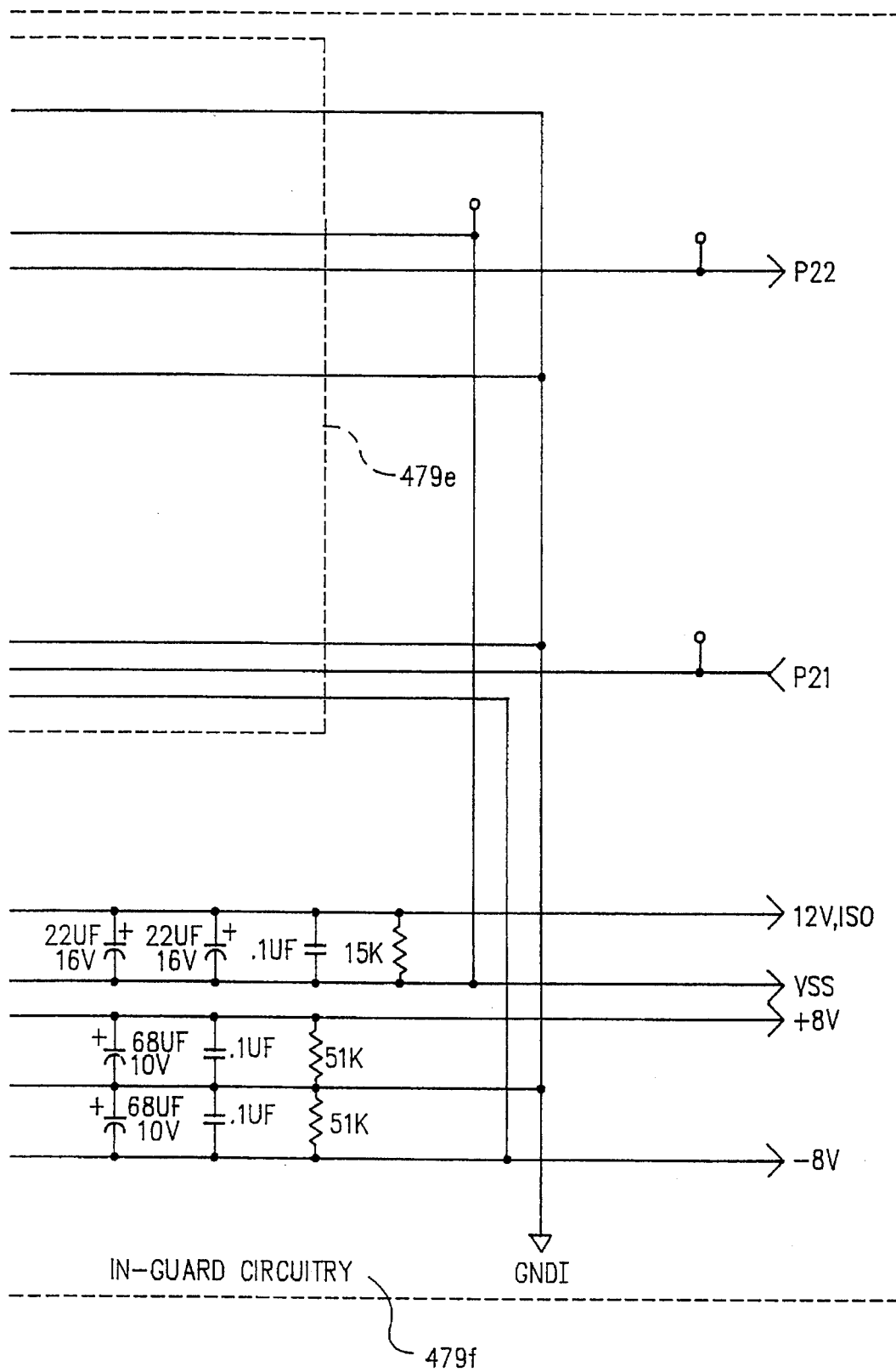
Figure 22C:
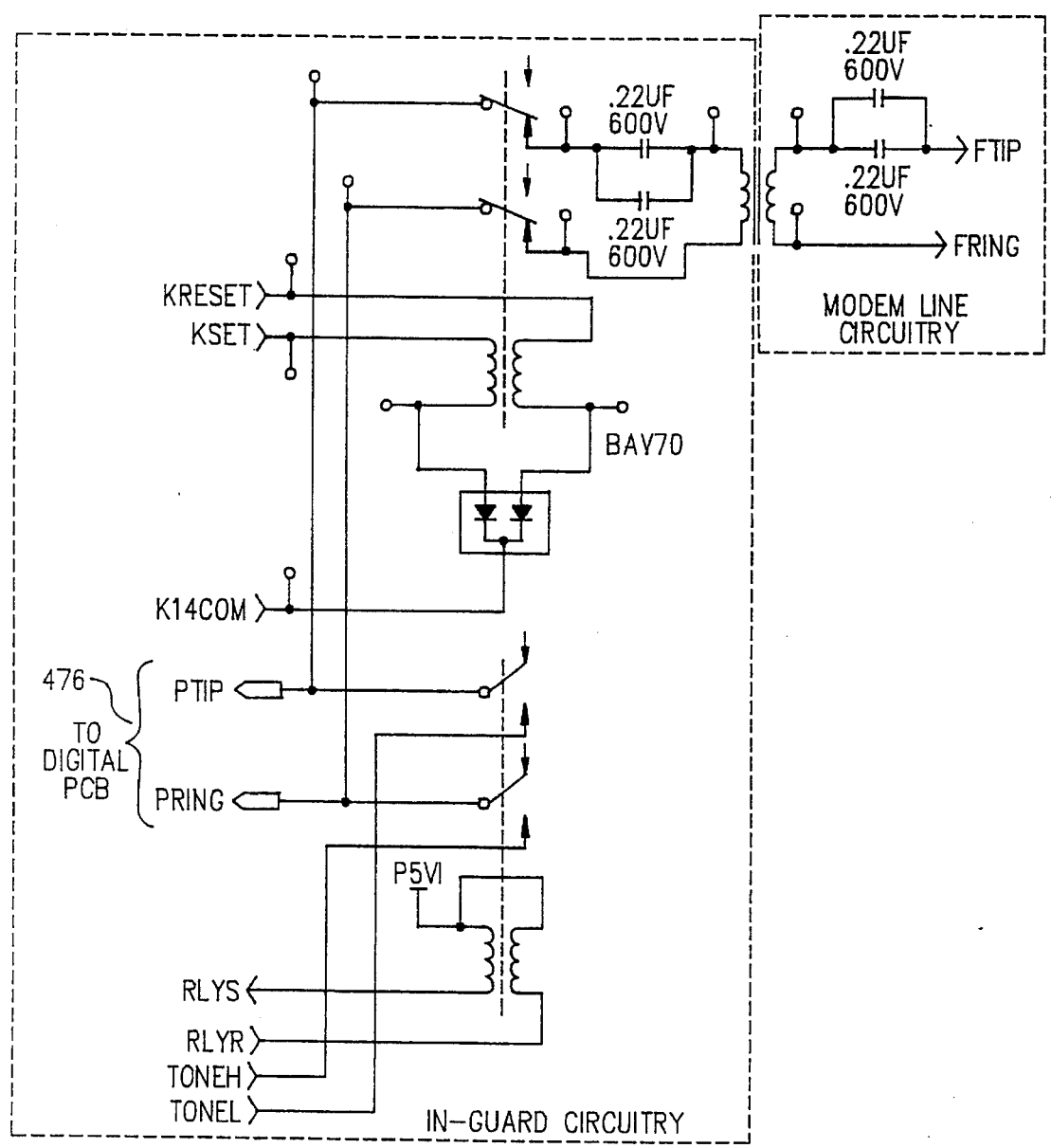

FIGS. 22A, 22B and 22C depict circuitry of the interface board 444. A first connector 474 provides for connection from the interface board to the digital board. A second connector 478 provides for connection from the interface board 444 to the modem board 434. The interface board 444 is also provided with connections 478 to the system board 434 and 480 to the analog board 442. A programmable sine wave generator 479a creates sine waves of constant frequency and amplitude, powered by a power supply 479b that provides +5 and −5 volts. A state machine controller 479c controls the interface to the sine generator 479a as well as the interface to the tone generator, relay drivers and a power-down latch. An isolated power supply 479d provides power to the slice 438 at +12, +8 and −8 volts. Optical isolation 479e is provided to protect the user from dangerous voltages which may be present at the test leads. This provides isolation between in-guard circuitry 479f and out-guard circuitry 479g.

Figures 19C, 19D:
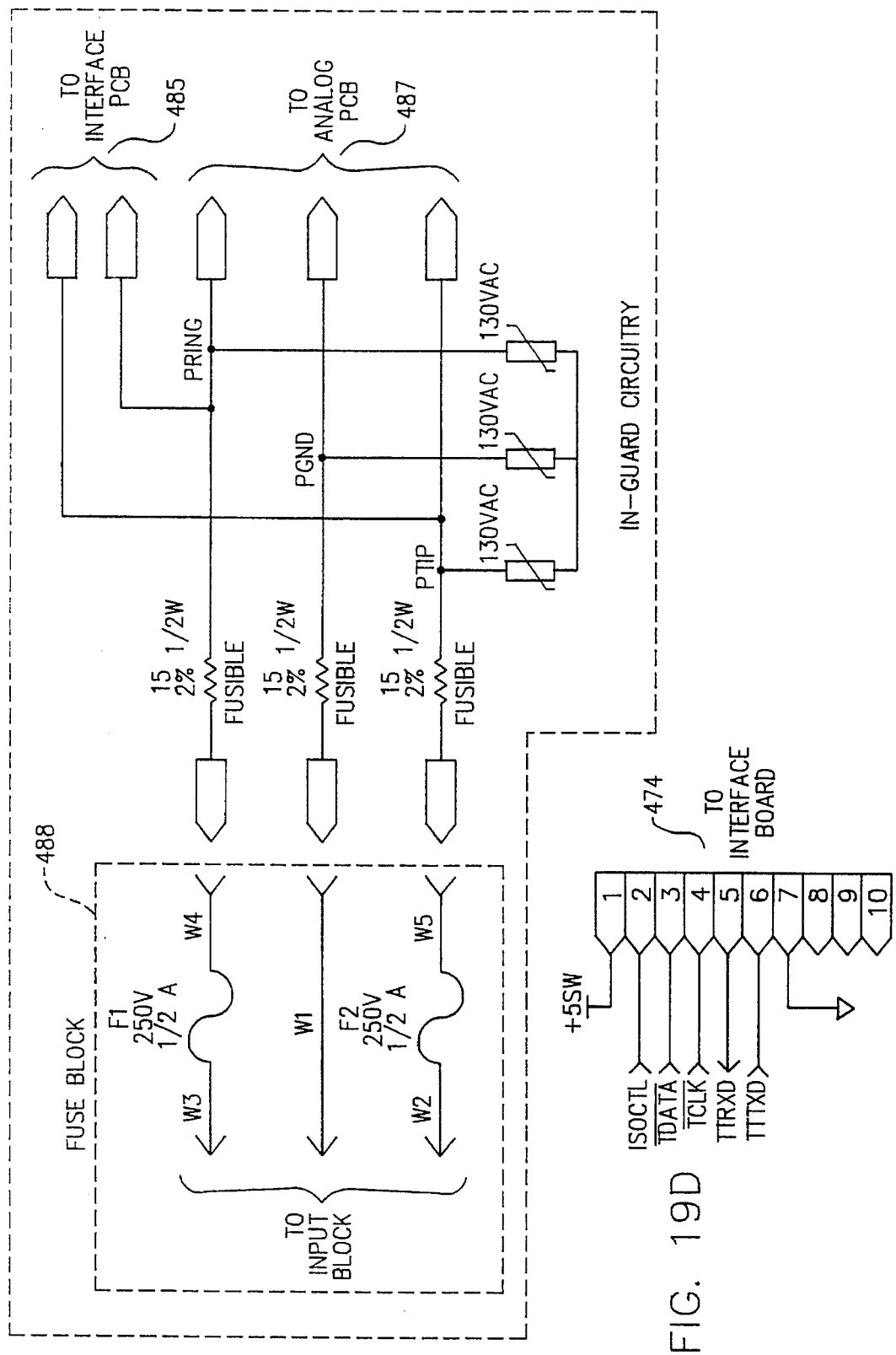

As depicted in FIG. 18, a side surface of the slice 438 includes a test lead connector 484 for connecting to a test lead cable having tip, ring and ground terminals. In one embodiment, the terminal ends of the test lead cable 26 include alligator clips for connection to phone lines. The slice 438 also includes a drawer 486 for holding active and spare fuses. In the embodiment depicted in FIGS. 23A and 23B, the drawer 486 can be withdrawn to disengage a pair of active fuses 488 and a pair of spare fuses 490 from engagement with active fuse sockets 492 and spare fuse sockets 494, respectively. The fuses 488, 490 and fuse drawer 486 are preferably symmetric top-to-bottom and left-to-right. In this way, when it is desired to replace the fuses 488 with the spare fuses 490 (e.g., after one or both of the original active fuses 488 has blown) the operator may withdraw the drawer 486 as depicted in FIG. 23A, and rotate the drawer 180° 496. Because of the symmetry, following such rotation the spare fuses 490 will be aligned with the active fuse sockets 492. The drawer 486 can then be re-inserted to engage the spare fuses 490 with the active fuse sockets 492. This provides a simple and rapid method of replacing active fuses with spare fuses. In one embodiment, the fuses are rated at 250 volts and 0.5 amps and are connected in the tip and ring line test leads in an in-line fashion, as depicted in FIG. 19C.

Figure 24:
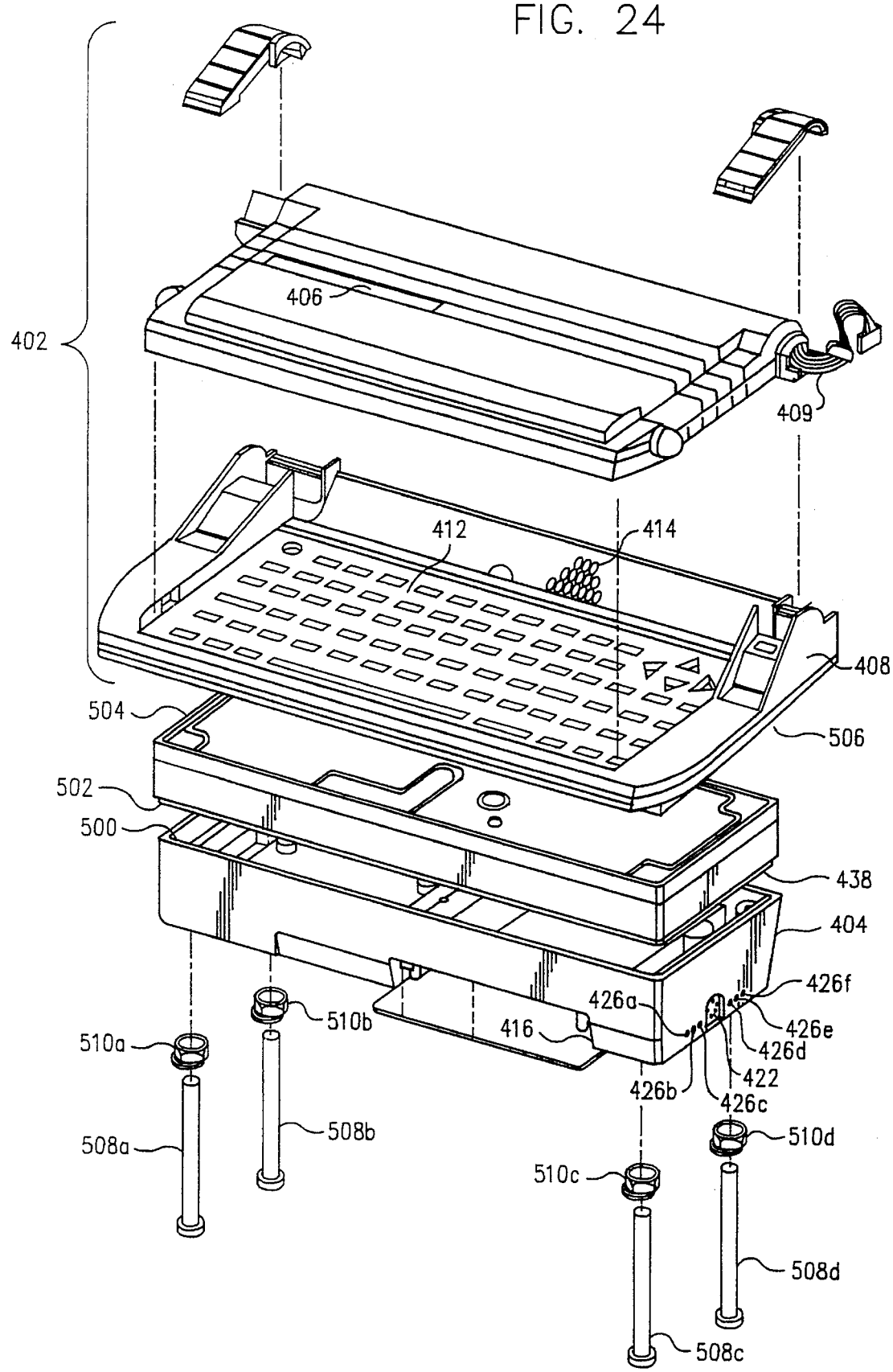
FIG. 24 is an exploded view of the apparatus of the FIG. 13.

As depicted in FIG. 24, when the slice 438 is installed in the administrative computer 402, 404, the three components 402, 438, 404 are coupled together as a rigid unitary package. In the depicted embodiment, this is accomplished by inter-engagement of a lip 500 on the upper rim of the lower portion 404 with a shoulder 502 on the lower rim of the slice 438 and by engagement of a lip 504 on the upper rim of the slice 438 with a shoulder 506 on the lower surface of the upper portion 408. Since it is desired to provide for configuring a device either as depicted in FIG. 12 or as depicted in FIG. 13, the lip 500 of the lower portion 404 is configured to engage with the shoulder 506 on the lower surface of the upper portion 408. Thus, to permit reconfiguration of the device from that as depicted in FIG. 12 to that as depicted in FIG. 13, the slice 438 must be provided with a shoulder 502 of a size and shape to engage with the lip 500 of the lower portion 404 without the lip 500 having to be modified in such a fashion as to defeat its engagement with the shoulder 506 of the upper portion 408. Similarly, the lip 504 of the slice 438 must be configured such that it can engage with the shoulder 506 of the upper portion 408 without the shoulder 506 having to be modified in such a way as to defeat its engagement with the lip 500 of the lower portion 404. In one embodiment, the shoulder 502 is substantially identical in shape with the shoulder 506 and the lip 504 is substantially identical in shape with the lip 500. The mechanical engagement of the components 402, 438, 404 is completed using connectors such as bolts 508a–508d, feet 510a–510d with the bolts 508a–508d engaging with nuts or threaded holes attached to or formed in the upper portion 408. Electrical connections 436, (FIG. 17) 446, 476 and 478 (FIG. 20) among the components 402, 438, 404 can be achieved by any of a number of known wire connection devices, such as ribbon connectors or individual wires or cables.

Figure 20:
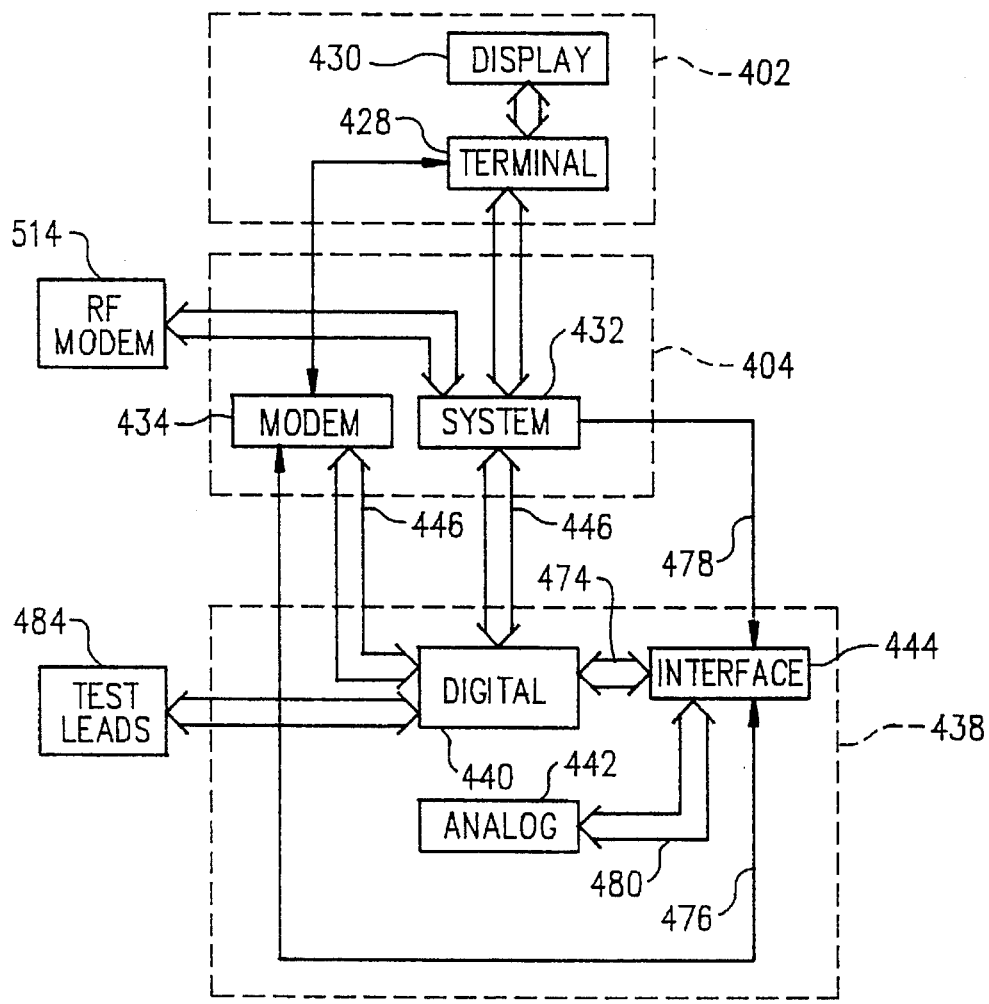
FIG. 20 is a block diagram of the apparatus of FIG.

The modem 434 depicted in FIG. 20 is, in one embodiment, a land-line modem of a type well-known in the art. In one embodiment of the invention, an RF model 514 is provided in addition to or in place of the land-line modem 434. The RF modem 514 can be configured for connection to a number of types of wireless or radio frequency networks, including the Advanced Radio Data Information Service (ARDIS), the Wireless In-house Network (WIN), the Local Area Wireless Network (LAWN), and the data Personal Communications Services (PCS) systems. As one example, the ARDIS, consisting of the radio frequency (RF) system of IBM and the shared-use radio data network of Motorola, communicates with X.25 or LU 6.2 protocol. The RF modem 514 can be provided using a number of RF modem devices known in the art. Providing an RF modem 514 significantly enhances performance of the present invention when configured as a telephone repair/installation device, as compared with the previous uses of an RF modem. This is because the present invention will typically be used in locations where phone service is non-existent or defective thus rendering a land-line modem 434 inoperative or unreliable. By employing an RF modem 514, the technician who is installing or repair telephones or telephone lines can communicate with a central office or automated system for such purposes as downloading or uploading data, including administrative data, or automated requests for test signals.

In the depicted embodiment, the RF modem 514 is provided as an external modem (e.g., connected through a communication port 420, 422, or 424). (It is possible to locate an RF number as an internal device, i.e., as part of a slice 438, as part of the upper portion 402 or as part of the lower portion 404, as depicted in FIG. 20. The RF modem 514 can also be configured in a separate slice so that RF modem capability can be provided, as desired, for use in a number of different applications. Among other uses of an RF modem are (1) delivery of administration information to or from the mobile computer 402, 404 via RF for purposes of supporting the testing of telephone circuits, (2) delivery and/or collection of further administrative data for integration of telephone line test information through the mobile computer, (3) delivery of administrative close-out information (including actual test results), and (4) transmission, reception, routing, storage and display of messages such as electronic mail ("e-mail") messages.

Figure 1:
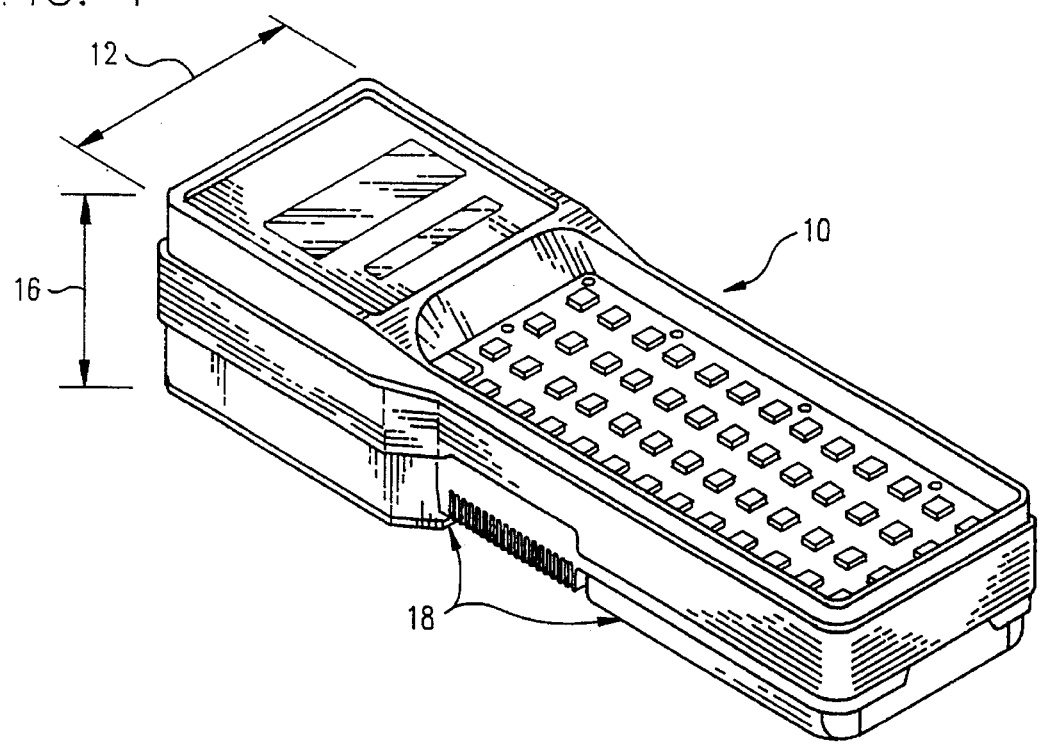
FIG. 1 is a perspective view of a hand-held administrative computer.
Figures 3, 21D:
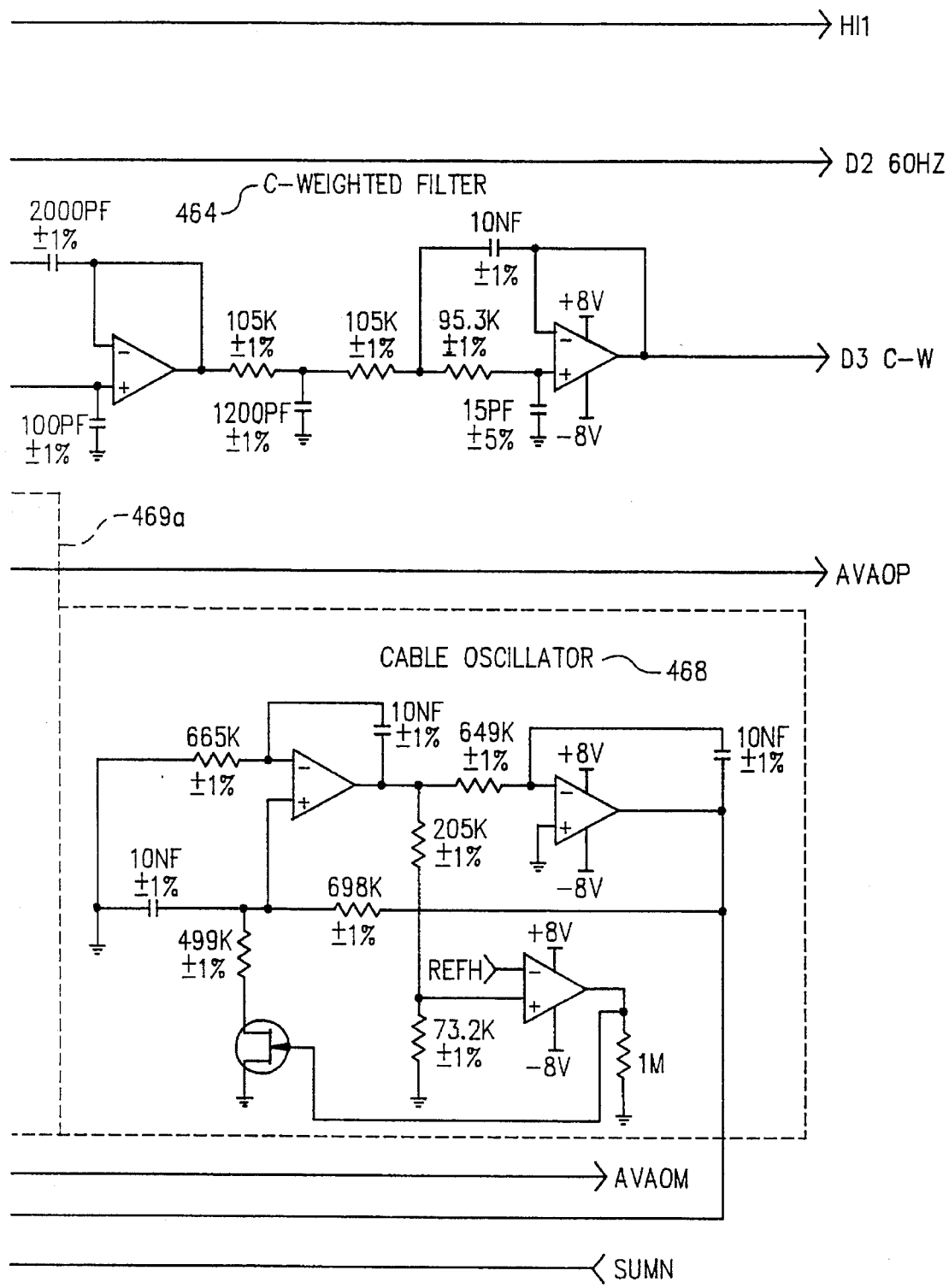
FIG. 3 is an exploded, perspective view of apparatus according to one embodiment of the present invention, with portions broken-away to show interior components.
Figures 1, 21E:
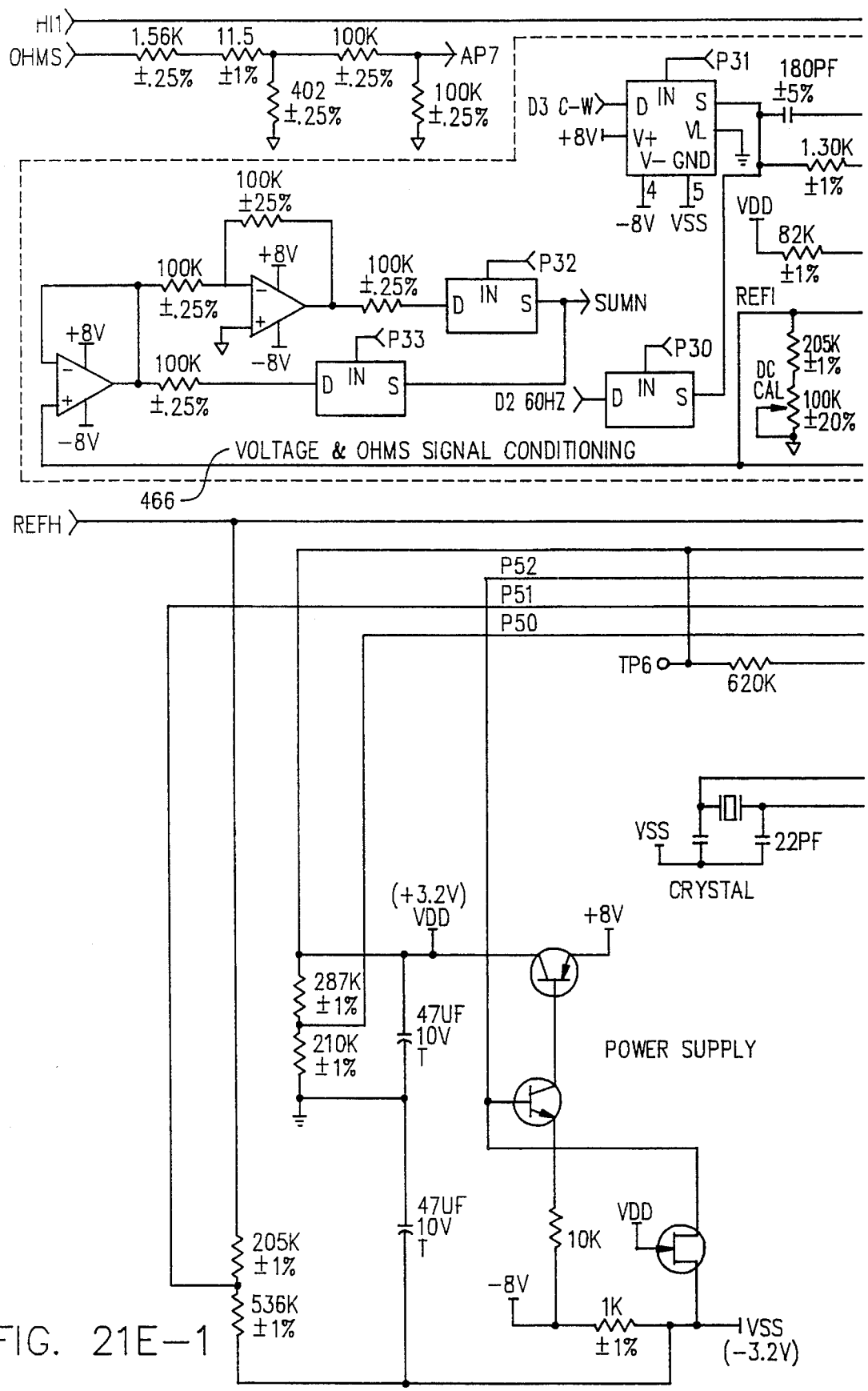
Figures 2, 21E:
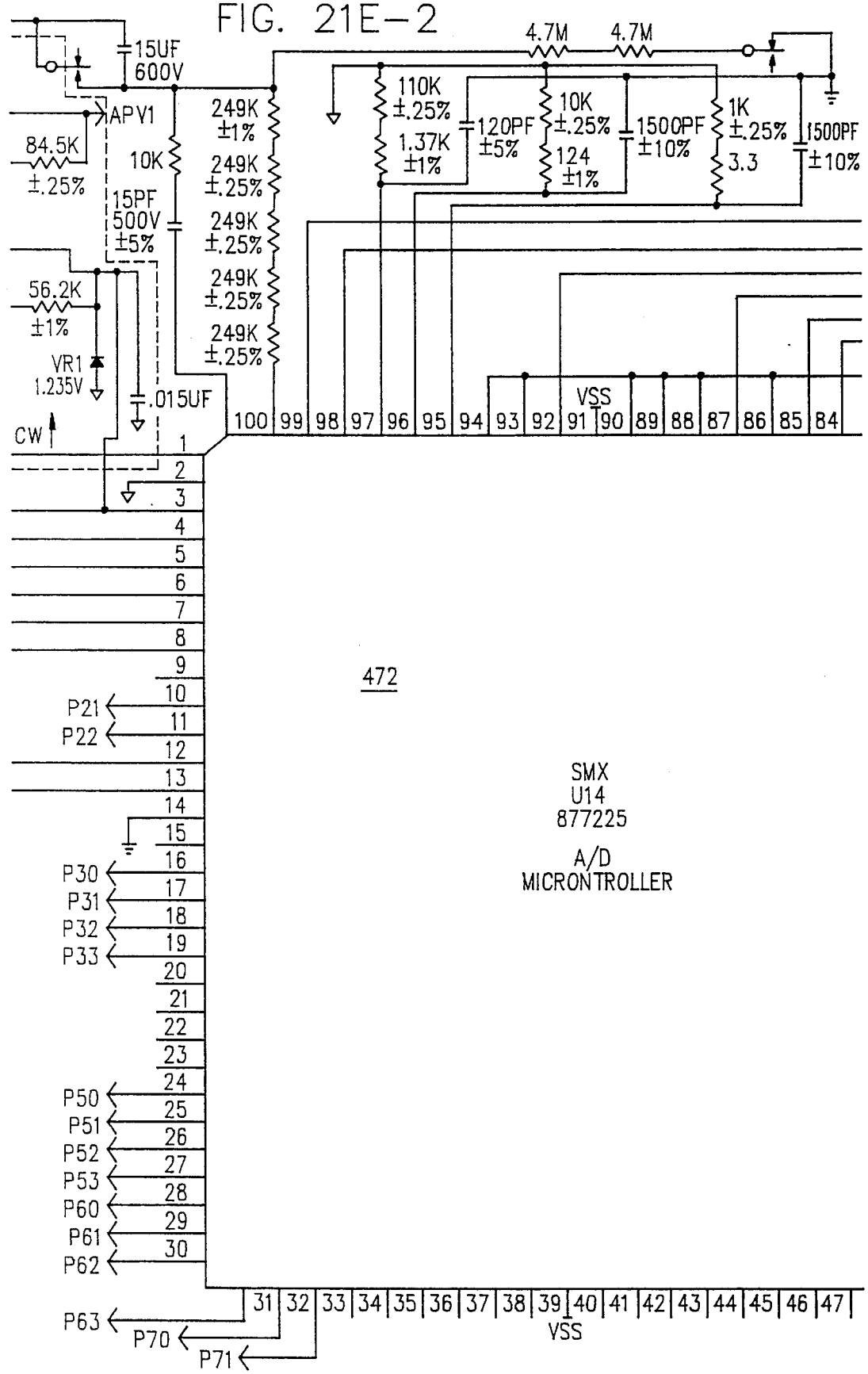
Figures 3, 21E:
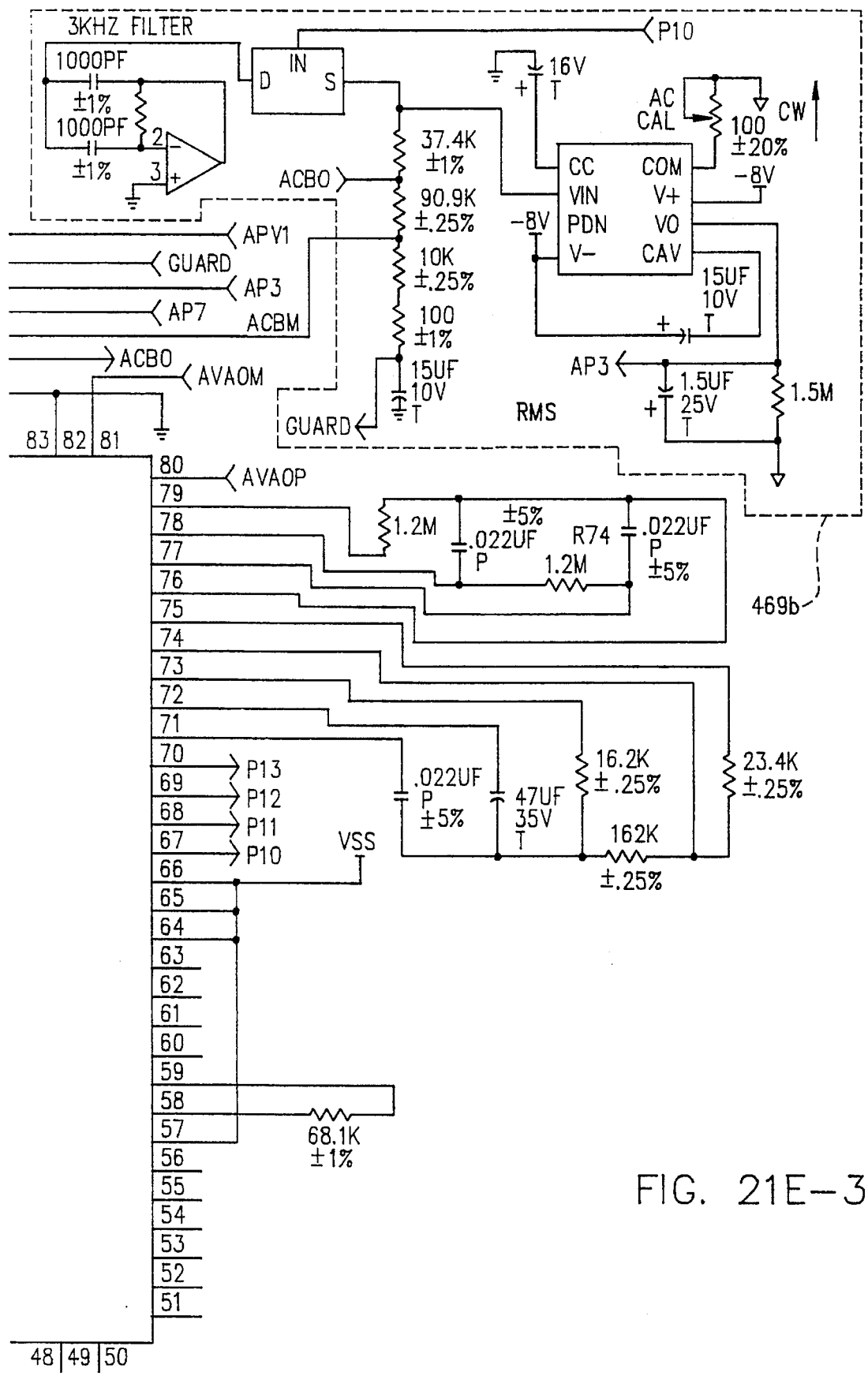
Figure 3:
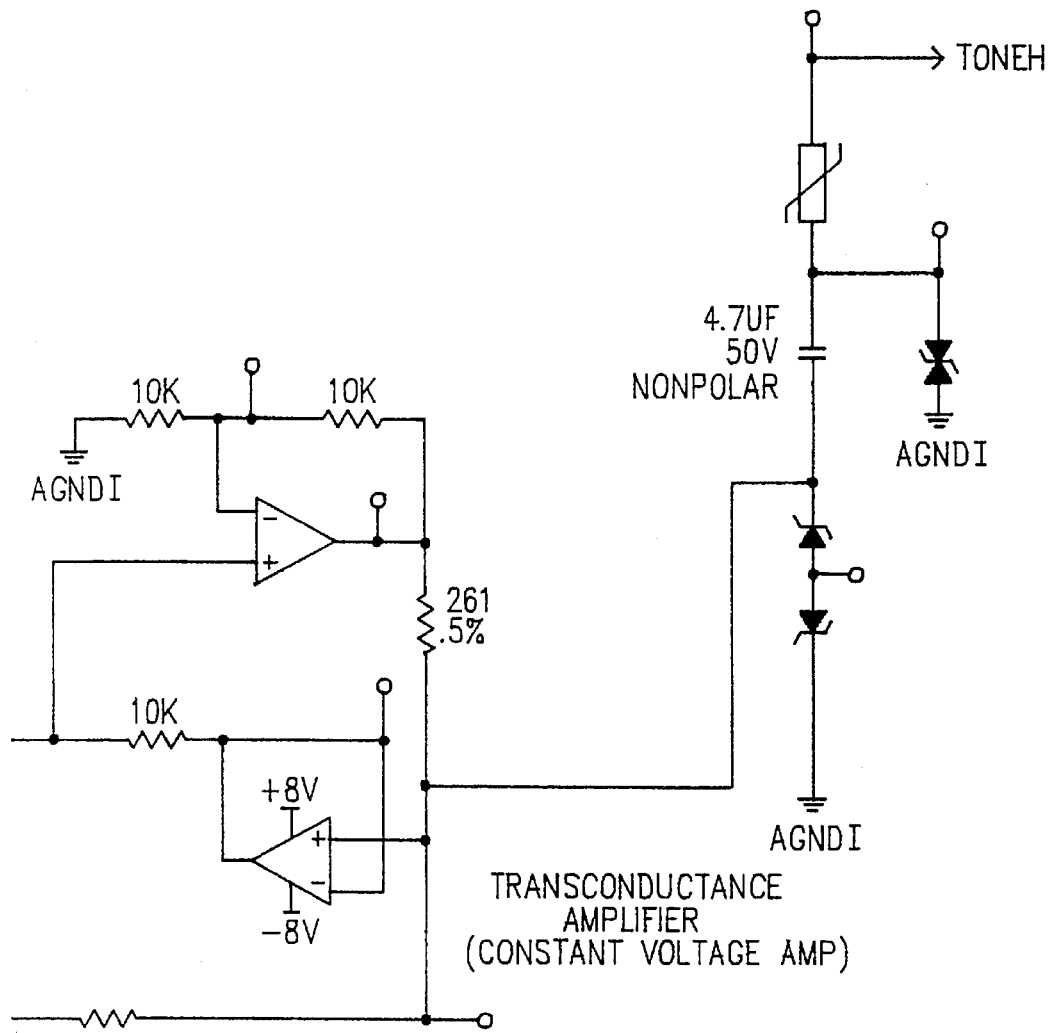

According to one embodiment, as depicted in FIGS. 1–3, the administrative computer is a hand-held administrative computer which includes a CPU, a memory, a keyboard for input, a display for output and a portable power source. The administrative computer may be programmed (such as by downloading from a central computer) to store information relating to the service call, including the location of the equipment, customer name and other customer information, trouble ticket number, the nature of the problem reported, scheduling, and other dispatching information. It also can store telephone numbers such as remote computer numbers for modem connections, telephone company test numbers and the like. The administrative computer preferably is powered by rechargeable batteries.

In one embodiment, the administrative computer is a hand-held administrative computer Model T4000 sold by ITRON, Inc., Spokane, Washington. The T4000 is a microprocessor based computer provided with random access memory (RAM) and powered by a rechargeable battery. The CPU is Model 80C88 produced by Motorola, Inc. The T4000 includes a keyboard and an LCD display. The T4000 also includes two serial ports and a modem.

Figure 2A:
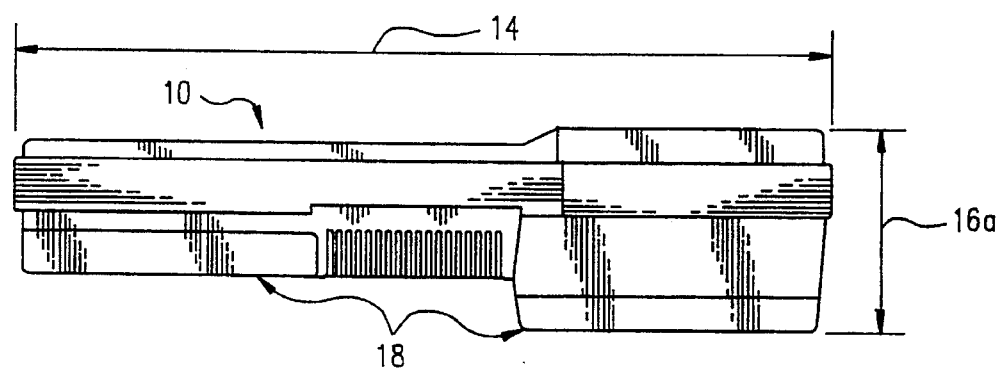
FIG. 2A is a side view of the computer of FIG. 1.
Figure 2B:
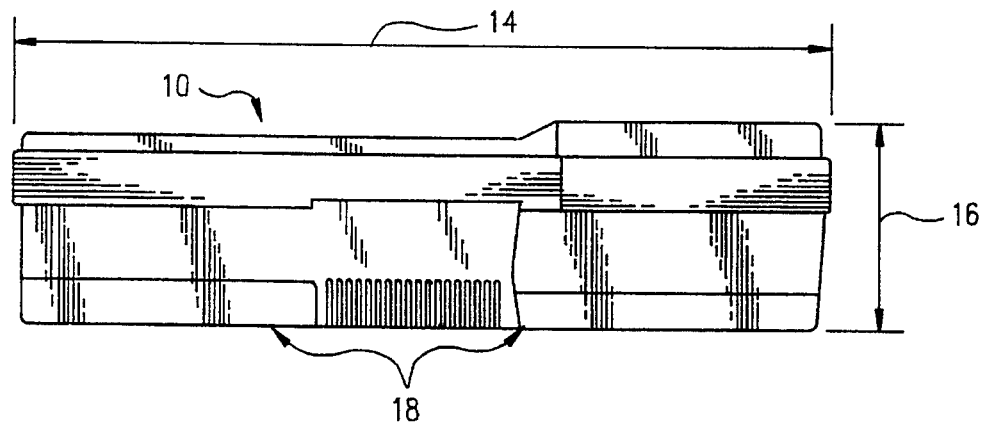
FIG. 2B is a side view of apparatus according to one embodiment of the present invention.

FIGS. 1 and 2A depict the external appearance of one model of the T4000. (See U.S. Pat. No. Des. 302,265.) The T4000 10 has a width 12 of about 4.0 inches, a length 14 of about 11.5 inches, and a depth 16a of about 3.0 inches. The back covers 18 of the T4000 are removable. FIG. 2b depicts the appearance of an embodiment of this invention described below.

As shown in FIG. 3, one embodiment of the present invention includes an administrative computer 20 and a field service module or FSM 22 which can be integrally coupled to the administrative computer 20 after removing the bottom covers 18. The FSM is sufficiently small and lightweight that, after it is coupled to the T4000, the resultant apparatus is a hand-held device with external dimensions nearly the same as the external maximum dimensions of the T4000 administrative computer. In the preferred one embodiment, the depth 16 of the apparatus in the region of the keyboard will be about equal to the depth 16a of the T4000 in the region of the display.

For the embodiment shown in FIG. 3, the FSM includes a housing 24; a test lead cable 26, having tip, ring and ground terminals 28, 30, 32; three printed circuit board assemblies; and a cover assembly 40. The assemblies include an analog board 34, a digital board 36, and a protection board 38. The FSM 22 is coupled to the administrative computer 20 by a system connector 42 which is positioned on the digital board 36. A corresponding mating connector (not shown) resides in the administrative computer 20. In one embodiment, the connector 42 is a multi-pin connector which provides interconnections for data, addresses, control signals, power, and ground.

The digital board 36 provides interfacing to the administrative computer, including control of communication links. The analog board 34 houses the analog circuitry necessary for performance of the tests, and includes analog-to-digital converters, to allow the administrative computer to communicate to other equipment external to the hand-held unit, for example, to a "cradle" where the unit is stored. The protection board 38 houses input and protection circuits such as fuses and some I/O ports. In one embodiment, the protection board 38 is configured to be easily and inexpensively replaceable in case of over-voltage damage. The housing 24 includes a speaker 44 which is used for audio reproduction, such as reproduction of telephone line signals.

Figure 4:
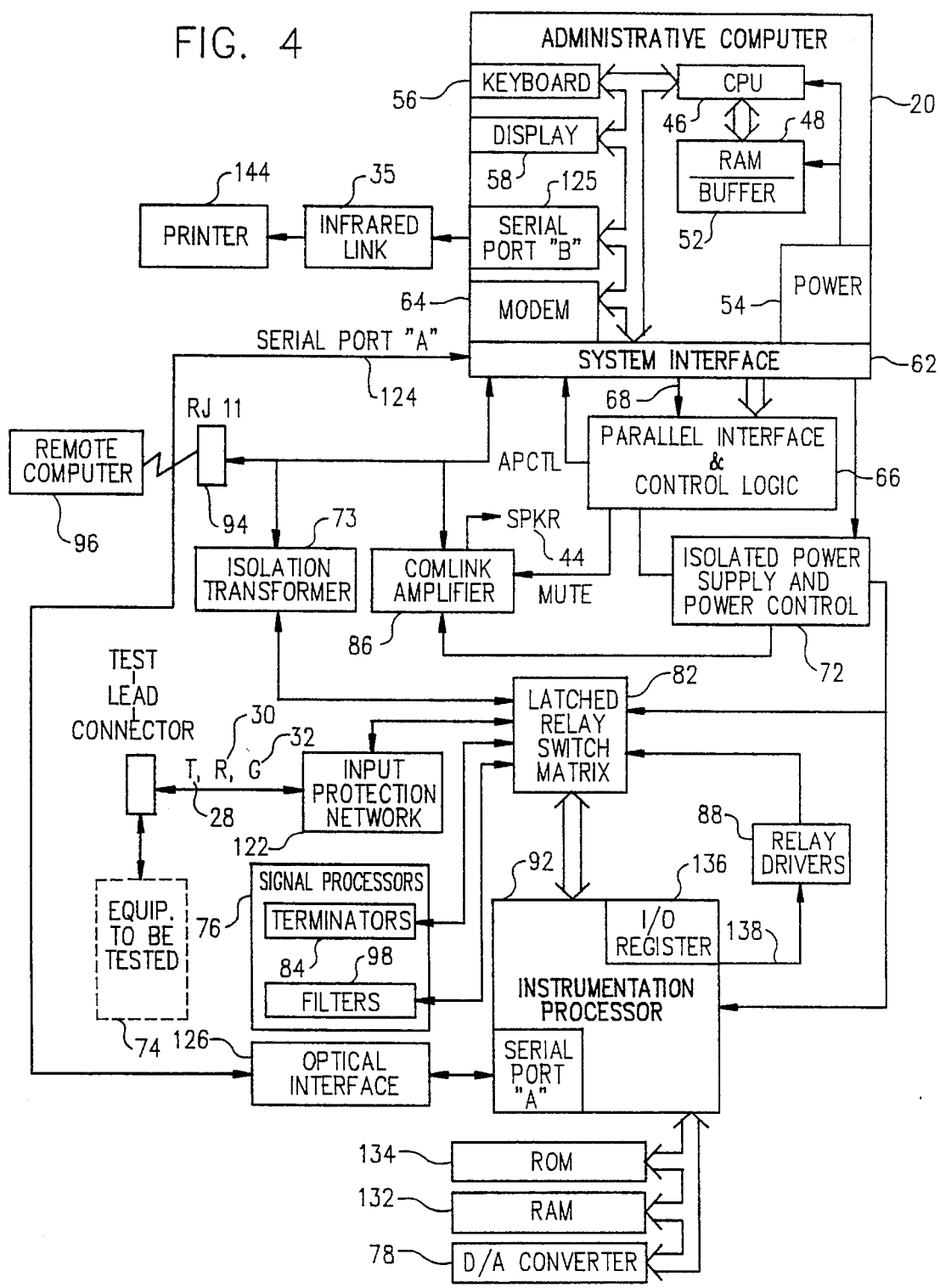
FIG. 4 is a schematic block diagram of the apparatus according to one embodiment of the present invention.

FIG. 4 is a functional block diagram of the apparatus depicted in FIG. 3. The administrative computer 20 includes a CPU 46, a memory 48, including a buffer portion 52, a battery power supply 54, a keyboard 56 and liquid crystal display 58. A system interface 62 includes the coupler 42 (FIG. 3) which is connectable to the mating coupler of the administrative computer 20. A modem 64 is included in the administrative computer for communication with other computers. The power supply is in the administrative computer 20 and includes a rechargeable NiCad battery pack. Power is supplied to the analog board 34 from the digital board 42 through an isolation transformer 73.

The FSM 22 includes parallel interface and control logic 66 with registers required for bit-level power control to the FSM and volume control to the audio ("comlink") amplifier. A transformer-isolated power supply and power control 72 is used to power all test circuitry and interfaces, including relay coils.

Signals received from the equipment to be tested 74 over the test lead connector through the input protection network 122 can be processed by using signal processors 76 or digital-to-analog converters 78. The test lead connector 28, 30, 32 provides for attachment of the tip, ring and ground test leads and probes 26, while a matrix of relay switches 82 effects the desired connections. The latched relays route signals between the test lead inputs 28, 30, 32 and the appropriate instrumentation circuitry. Relays in the matrix are also used to select proper termination elements 84, other signal conditioning circuits 76, and to connect the test leads to the comlink amplifier 86 and to the modem 64. When filters 98 are employed for making measurements, all filters are turned on and off through commands passed from the administrative computer 20 to the instrumentation processor 92 via a serial command protocol. To minimize operating current, the relays in the relay matrix 82 are preferably relays, with each latching relay having a set and a reset input.

Relay driver transistors 88 are used to interface the instrumentation processor 92 to the relay switch matrix 82. Two drivers per relay are used, one each for the set and the reset coils. The relays are set by writing a bit configuration representing the desired relay configuration to an I/O register 136 which controls the relay drivers.

An RJ11 connector 94 is provided on the FSM 22 for connecting the modem 64 and the audio amplifier 86 to a telephone line through a conventional telephone cable. The RJ11 connector 94 also permits the administrative computer 20 to connect with a remote computer 96, for example, to download test result information and trouble ticket information. The RJ11 connector 94 can also be used in support of a Craft Access System (CAS). The Craft Access System is a telephone central office system which can be used for remote computer access to information such as customer service request information. Another use of the RJ11 connector 94 is for dialing telephone company numbers to request provision of a test signal over telephone lines to the equipment to be tested 74. The test leads 28, 30 can also be used for dialing.

The input protection network 122 includes fuses combined with varistors to protect the operator and the instrument. The audio amplifier 86 is a power amplifier with a programmable gain and mute function. The amplifier 86 and speaker 44 provide the function of monitoring for speech on the line and call progress monitoring when the modem is in use. The audio amplifier 86 is capacitively coupled to the FTIP and FRING lines from the modem 64. In one embodiment, the audio monitor function may be used independently of the test mode.

The instrumentation processor 92 is controlled by means of serial commands from the administrative computer 20. The processor 92 generally acts as a slave processor to the administrative computer 20, receiving and executing internal and external hardware setup commands, performing measurements of analog signals appearing at the test link connector input, and transmitting the results of these measurements back to the administrative computer 20 across the serial interface 124. Depending on commands received from the administrative computer 20, the instrumentation processor 92 will configure its internal hardware appropriately for the measurement being undertaken. In certain "submodes" (e.g., "auto ranging") this internal configuration will be transparent to the administrative computer software and to the user.

In one embodiment, the serial interface 124 between the instrumentation processor 92 and the administrative computer 20 is optically isolated 126 bi-directional, asynchronous, half-duplex. The T4000 administrative computer also includes a serial port "B" 124 which can be used, e.g. via an optical interface 35, to supply data to a printer 144. There is galvanic isolation between all hardware connected to the test functions, including the instrumentation processor, and the T4000 for operator safety.

In one embodiment, serial communication is conducted using RS-232C format. Communications consist of two parts: a command sequence and a response sequence. The command sequence of the administrative computer will not transmit a command without first receiving an inquiry sequence from the instrumentation processor. To interrupt the instrumentation processor, the administrative computer 20 will initiate a break condition by causing the transmit line to be held in a low state (rather than the normal high or marking condition). The instrumentation processor 92 checks for this condition periodically during the measurement process. Upon detecting this condition, the instrumentation processor 92 aborts any current measurement, issues the inquiry sequence, and monitors the line 124 for a subsequent command.

The instrumentation processor 92 includes a microprocessor with on-chip random access memory 132 and read only memory 134 which is used for storage of program information. The processor is a high-speed, eight-bit microprocessor. Among the functions of the instrumentation processor 92 are: converting a pulse train from the A/D converter 78 to the appropriate value; adjusting A/D scaling factors to perform auto-ranging and polarity adjustment; controlling relay settings; communicating with the administrative computer 20; interpreting voltages into appropriate current, capacitance, ohms, etc. and, performing frequency counts in the frequency counting mode.

In one embodiment of the present invention, the apparatus is configured for use by telephone company field representatives for use in testing telephone equipment. Software contained in the administrative computer is used not only for performing the administrative functions previously described, but also for conducting and controlling testing, correlating test results with location information and other administrative information, closing out trouble tickets and/or downloading information to remote computers for administrative functions.

In one embodiment, users can choose from among a standard set of test routines or can write and store their own test routines. This provides a capability for the user to make the apparatus function the way the user desires, in a manner consistent with the operating procedures of the user. Using the software, test data can be selectively stored in memory and later printed or communicated to another processor for further analysis.

Table II provides a summary of a number of tests that are provided in an embodiment of the invention along with an indication of the leads that are used and the range of returned values. In this table, "T" denotes tip "R" denotes ring and "G" denotes ground.

TABLE II

| Measurement | Leads | Returns |
| --- | --- | --- |
| High DC T to R | T–R | 0–400 V |
| High DC T to G | T–G | 0–400 V |
| High DC R to G | R–G | 0–400 V |
| DC Volts T to R | T–R | 0–400,000 mV |
| DC-Volts T to G | T–G | 0–400,000 mV |
| DC Volts R to G | R–G | 0–400,000 mV |
| High AC T to R | T–R | 0–400 V |
| High AC T to G | T–G | 0–400 V |
| High AC R to G | R–G | 0–400 V |
| Comm Mode AC | T/R–G | 0–400 V |
| AC Volts T to R | T–R | 0–400,000 mV |
| AC Volts T to G | T–G | 0–400,000 mV |
| AC Volts R to G | R–G | 0–400,000 mV |
| Ohms T to R | T–R, T–G, R–G | 0–3,500,000 Ω |
| Ohms T to R (short T to G) | T–R | 0–3,500,000 Ω |

TABLE II-continued

| Measurement | Leads | Returns |
| --- | --- | --- |
| Ohms T to G (short R to G) | T–G | 0–3,500,000 Ω |
| Ohms R to G (short T to R) | R–G | 0–3,500,000 Ω |
| Capac T to R (short T to G) | T–R | 0–600 nF |
| Capac T to G (short R to G) | T–G | 0–600 nF |
| Capac R to G (short T to R) | R–G | 0–600 nF |
| Capacitance T to R | T–R | 0–600 nF |
| Capacitance T to G | T–G | 0–600 nF |
| Capacitance R to G | R–G | 0–600 nF |
| AC Cond T to R | T–R | 0–95 µS |
| AC Cond T to G | T–G | 0–95 µS |
| AC Cond R to G | R–G | 0–95 µS |
| Frequency | T–R | 0–20,000 Hz |
| Freq 60 Hz filter | T–R | 0–20,000 Hz |
| Freq 3 KHz filter | T–R | 0–20,000 Hz |
| Freq 60 Hz and 3 KHz | T–R | 0–20,000 Hz |
| Loss | T–R | –97 to +14 dBm |
| Loss 60 Hz filter | T–R | –97 to +14 dBm |
| Loss 3 KHz filter | T–R | –97 to +14 dBm |
| Loss 60 Hz and 3 KHz | T–R | –97 to +14 dBm |
| Noise | T–R | 0–100 dBrnC |
| Power Influence | T–R | 0–100 dBrnC |
| Loop Current | T–R | 0–100 mA |
| TG Current 400 | T–G | 0–100 mA |
| RG Current 400 | R–G | 0–100 mA |
| TR Current 5490 | T–R | 0–100 mA |
| Ground Current | T–R | 0–400,000 mV |

In operation, a technician connects the three test leads of the apparatus to a telephone line and either manually or automatically performs a series of line tests to diagnose any problems. The results of these tests are stored so they can be reviewed, saved, or printed when the testing is complete.

FIG. 5 is a schematic diagram illustrating an example of the technique for providing various filters 98 and terminators 84. Of course, other networks can be used depending upon the desired interconnections among the filters and terminators. In the embodiment depicted, the filters are: a 3 kHz low-pass filter 102; a 60 Hz high-pass filter 104; and a C-message weighted filter 106 which is a filter provided in accordance with IEEE Standard 743-1984106. Other well known filters or other signal processing elements also can be employed. Signals can also be connected "flat" (no filter applied). Any of these filters or the flat connection can be used with any of the terminations (described below). As depicted in FIG. 5, the FSM 22 is equipped with telephone-specific load and bridge terminations to allow accurate measurement of analog telephone lines.

In one embodiment the terminations include a DC holding circuit 108 takes the phone line off the hook by drawing a constant current. The holding circuit provides a high AC impedance to the line so that it can be used in conjunction with the 600 ohm AC termination for noise testing. A 430 ohm 5 W resistive termination 112 places a load across tip and ring and to measure loop current. A 600 ohm AC termination 114 puts 600 ohms across tip and ring. This termination is used to load the line for AC measurements for noise and circuit loss. A 100 Kohm 0.25 W termination circuit 116 puts 100 Kohms in series with tip and ring to measure power influence. Input lead connections (tip to ring, tip to ground, ring to ground) 118 short any two selected input leads together for internal diagnostic testing and power influence.

Figure 6:
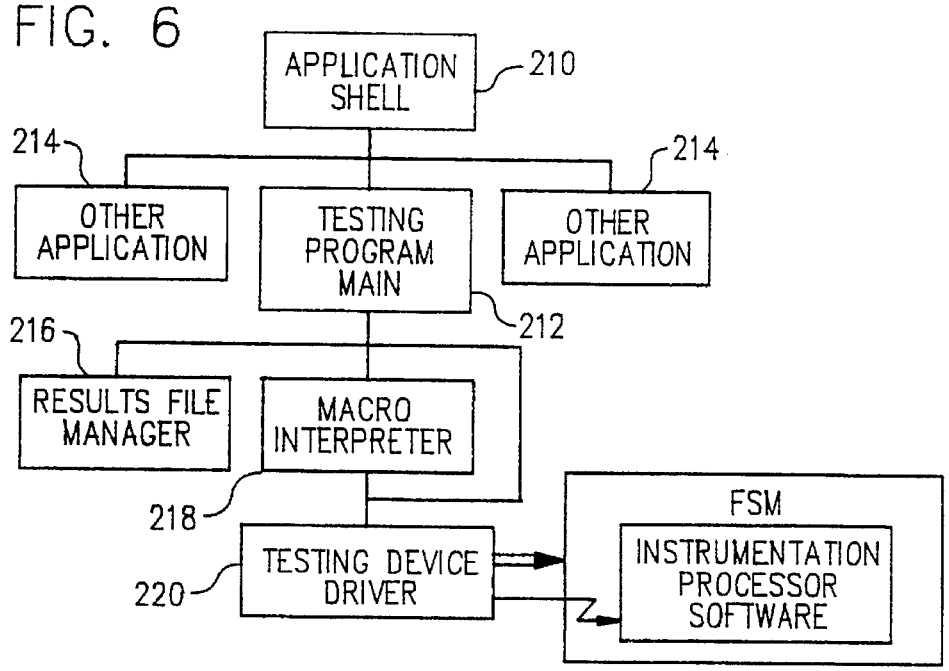
FIG. 6 is a block diagram of the major components of a software-directed method according to one embodiment of the present invention.

The major subsystems of the testing program system are shown in FIG. 6. The application shell 210 provides user access to the various capabilities of the device. In one embodiment, the application shell includes a menu system from which the user can select among the testing program 212 and other applications 214. Examples of other applications are the Craft Access System applications, applications providing similar functions such as VT100, as well as other well known software.

Of course, many different types of screen displays can be used during operation of the testing program.

Typical display screens are shown in FIGS. 11A–11F. Static presentation screens, for example, as shown in FIGS. 11A and 11B, present information to the user such as results of tests. Data entry screens, for example as shown in FIG. 11C, allow the operator to review, print, store, or otherwise manipulate data. Menu screens, for example as shown in FIGS. 11D, 11E and 11F, present options to the user for selection. Error message screens, for example as shown in FIG. 11G, explain hardware or software problems to the user. Of particular benefit to the administrative system described here are measurement screens which present continuous, minimum, maximum, or average readings of a measurement, and can present analog bar graphs for the present values. In one embodiment, continuous measurement screens are used with voltage, resistance and capacitance tests, and also may be used with custom tests.

In configurations where the computer has graphics display capabilities (such as a T5000 computer, as depicted in FIGS. 12–24), it is also possible to provide a time-based or history display of a continuous measurement. This is achieved by performing continuous or repeated measurements and storing the measurement results in memory. Such stored measurements can be displayed in a graphical fashion, e.g., as a line graph having time as one axis. FIG. 25 depicts a screen showing a time-reference or history line graph of tip-ring DC volts.

The testing program main module 212 (FIG. 6) presents the testing system to the operator. This module 212 controls test selection and execution, system parameter modifications, print functions, retrieval, review and editing of test results. The testing program main segment 212 also contains system functions that are not directly related to manipulating test measurements such as maintenance functions and downloading of new test macros from another processor. As shown in FIG. 6, the testing program main module 212 is connected to a results file manager 216, a macro interpreter 218, and a testing device driver module 220.

The results file manager 216 is software which provides data access routines to its various components of the system. Typically, results data are stored in two memory buffers— one buffer contains current results that are saved or discarded at the end of a test session, and the other buffer contains named test results from previous test sessions.

The macro interpreter 218 receives macro commands, interprets the macro commands, and executes the specified test macro. The interpreter 218 executes the macro until the test is aborted or completed and then returns control to the main module 212. The testing device driver 220 is responsible for communications between the administrative computer 20 and the FSM 22 and for directly controlling the FSM hardware.

Figure 7:
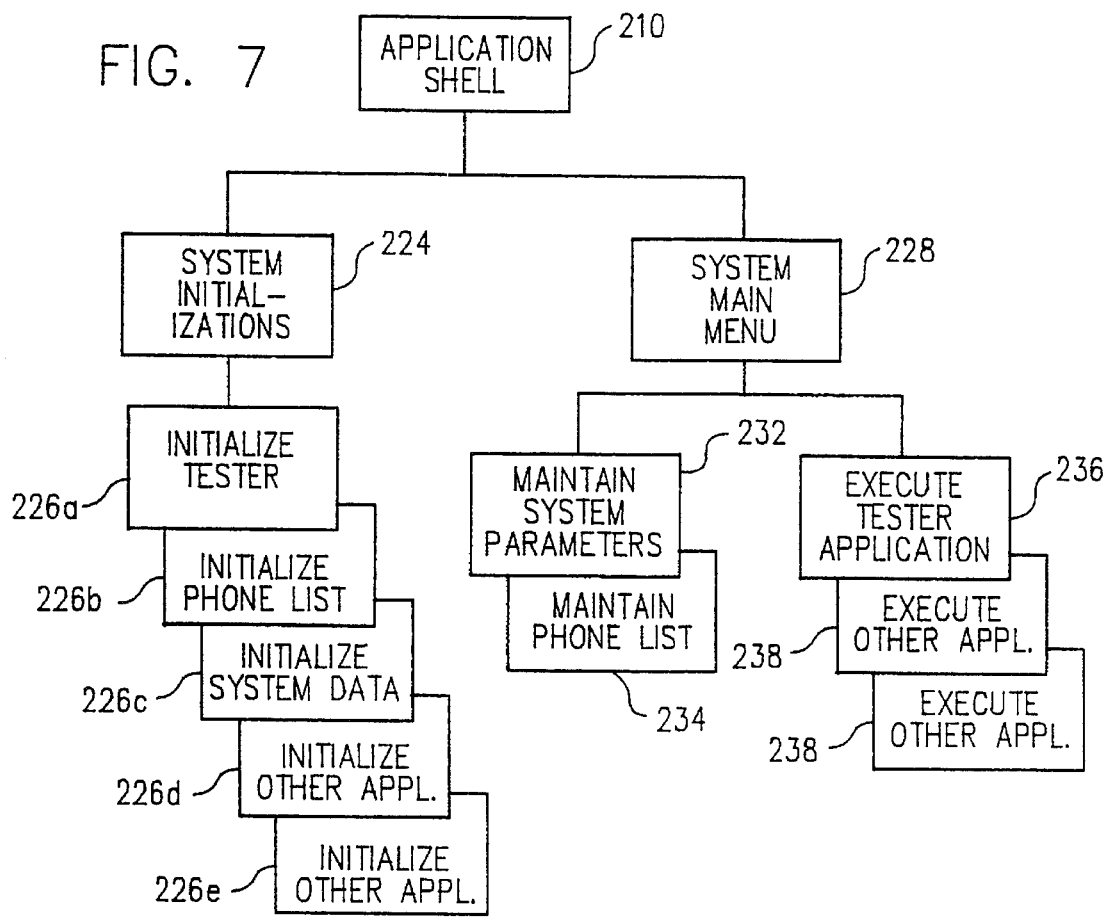
FIG. 7 is a block diagram of components of the application shell of FIG. 6.

FIG. 7 depicts the components of the application shell software. System initialization 224 is executed upon power up to perform system wide initialization. Next, initialization routines 226A to 226E are called for each of the specific applications. Initializing the tester 226A includes setting the FSM to its default state. This function also calls the hardware driver 220 to perform a series of diagnostic commands to verify that the FSM is both present and operational.

Following initialization, a main menu 312 (FIG. 11I) is presented to allow the operator to choose one of the applications or an administration menu to perform certain non-test "housekeeping" operations. For example, the administration menu allows system parameters such as date, time and FSM type to be updated.

Another option of the main menu 312 is an option 316 to display or revise a telephone list 234. Other options on the main menu can include an option 318 to execute the tester application 236 or options 322 to execute other applications.

If the tester application 236 (FIG. 6) is selected, the application shell 210 passes control to the tester program main module 212, which displays the testing program menu. The testing program menu (not shown) is similar to the other menu screens (FIGS. 11D, 11E, 11F, 11I) and allows choice of standard tests, custom tests, and utility functions. Selection of "standard tests" displays a standard test menu (FIG. 11D), "custom tests" displays a custom test menu (FIG. 11E), while "utility functions" displays a utility function menu (FIG. 11F). If the standard or custom test option is selected, control is passed by calling the main entry point for the testing program module 212.

Figure 8:
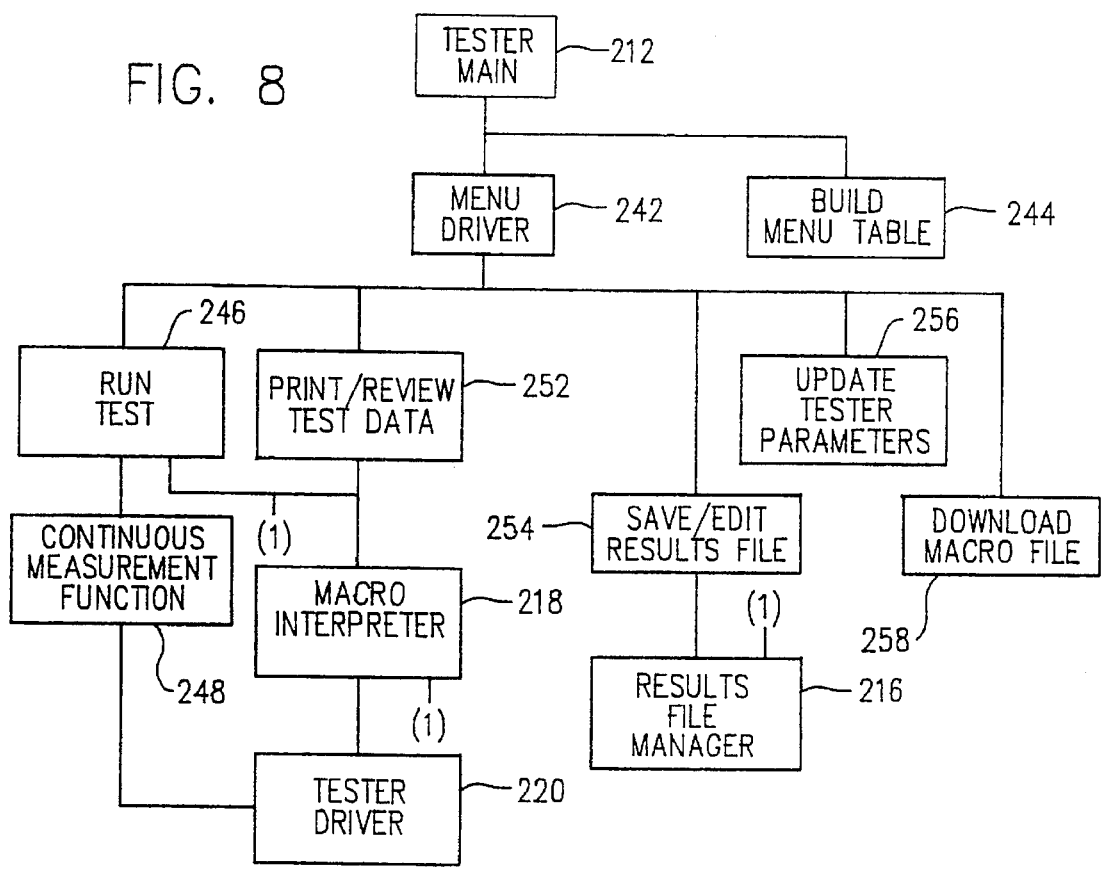
FIG. 8 is a block diagram of components of main tester of FIG. 6.
Figure 10:
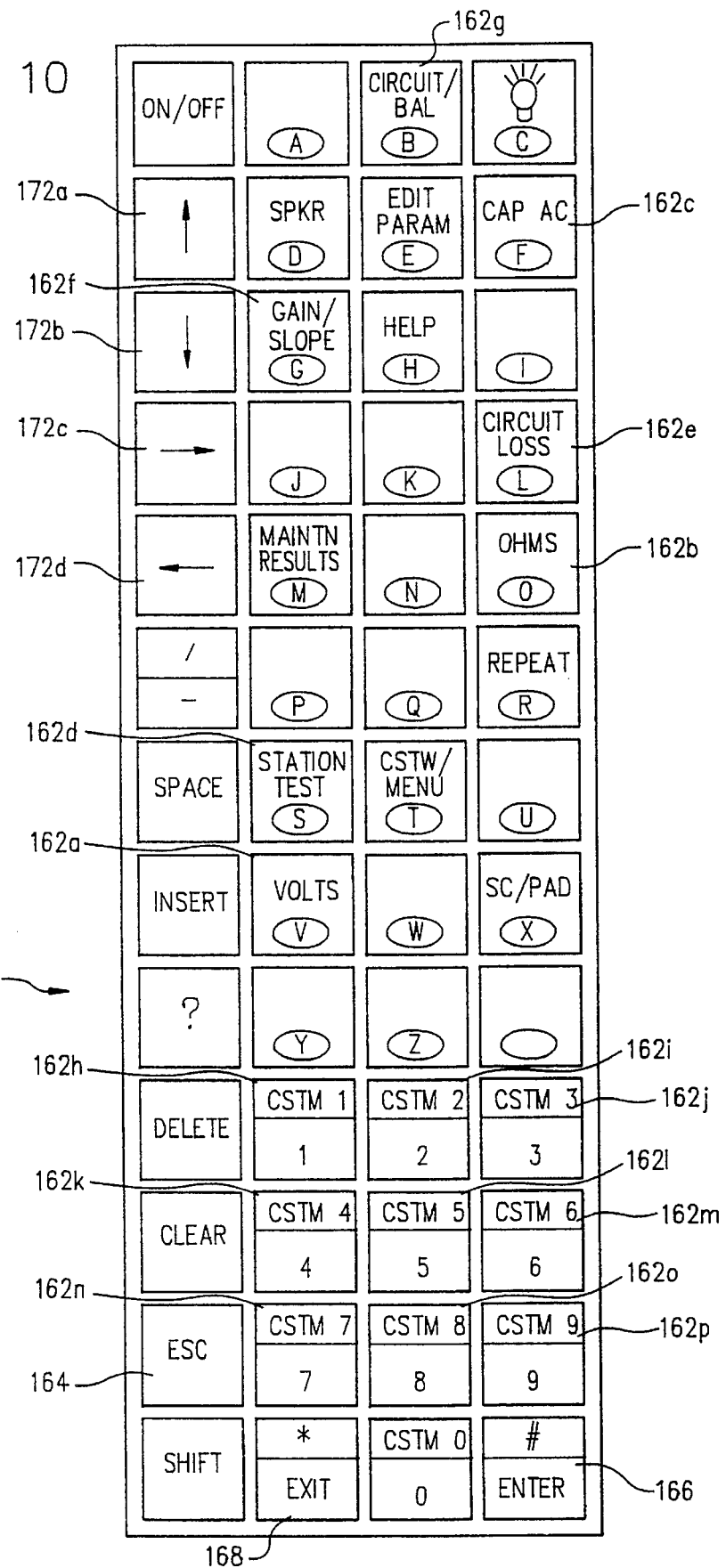
FIG. 10 depicts the keyboard according to one embodiment of the present invention.

FIG. 8 depicts the main components of the testing program main module 212. Once the tester main module 212 is entered, standard test menu 326 (FIG. 11D) or custom test menu 328 (FIG. 11E) created by the menu driver 242 is displayed. The operator can perform a series of different tests, optionally writing the test results to a buffer supplied by the calling application, until the exit function 168 (FIG. 10) is selected by the operator. The main menu module 212 provides a pointer to a buffer in memory that the application can use to pass test results back to the calling application. The calling application can then transfer the data to a host computer, process the data, or otherwise dispose of it.

The menu driver is a table-driven process 242. Because the menu options vary, depending upon the number of custom test macros defined, a single set routine handles all menus. Specific information about menu appearance and the actions to take for various selections is kept in a table of menu description structures. Each menu item has an entry in the menu table. The menu driver also handles activation of tester sub-functions through function keys. A function key pressed while a menu is displayed, causes the menu driver 242 to return back to the main menu 228 and execute the function associated with the key.

Many of the menus for the tester are fixed so that tables that describe them can be pre-initialized. Because tests can be customized, however, some menu tables can be built dynamically using a building menu table function 244. This process 244 is executed the first time software is executed after being down-loaded, and every time the test macros are modified.

Once the operator selects a specific test from the menu, the menu driver 242 passes this process to a pointer to the test macro to perform the test. The run test module 246 passes the pointer along to the macro interpreter 218 which controls execution of the macro. The macro interpreter 218 processes the macro until the test is completed or the test aborts.

Once a test is selected, an information screen (FIGS. 11A, 11B) is displayed to communicate the test results. Continuous measurement is invoked from the test results screens 332, 334 that appear after executing a test. An "*" symbol 336, 338 appears next to one of the test results and, using "up" and "down" arrow keys 172a, 172b (FIG. 10), can be moved next to any test result line on the display. The Enter key 166 starts the continuous measurement and displays the value next to the * symbol. The continuous measurement function 248 continues to execute the macro until the operator stops it. In one embodiment, the measure is displayed 342 as a bar graph 344, and arrow keys 172a, 172b can be used to change the scale of the graph. Minimum, maximum and average measurement values 346 are also displayed. In the embodiment depicted in FIG. 11H, the continuous current reading is displayed in larger characters than the minimum, maximum and average readings. The continuous measurement function 248 is told by the run test module 246 which measurement to display and only that measurement is displayed until the operator exits to the previous menu.

As a macro is executed, the interpreter 218 displays results (FIGS. 11A, 11B, 11H) and stores the measurements in the "current results" buffer in memory 132. Once the test is completed, the operator must press "Esc" 164 or "Exit" 168 to return to the previous menu. If the operator presses "Exit" 168 the results of the test are saved with the current results. If the operator presses "Esc" 164 the results are discarded. If an operator exits a continuous display with an "Exit" key 164, the minimum, maximum and average measurement results are saved in the "current results" file. Rather than using "Exit" or "Esc" to return to a previous menu, it is possible to run a series of tests by using a function key 162a–162p to start a new test. The results from the entire series of tests will be saved or discarded depending on whether "Exit" or "Esc" is pressed when the last tested series is completed.

Rather than performing a test, the operator may choose to print or review test data. To accomplish this, the user returns to the testing menu (not shown) and selects "utility functions". From the utility functions menu 352 the user selects "maintain results" 354. This will result in passing control to the print/review test module 252. This module reads the test results buffer, extracts the job names of previously saved results from the buffer and displays a data entry screen 256 (FIG. 11C). The job names are displayed 258 so that the operator can select the results to be reviewed. The data for each job consists of results of many tests. When the results are written, they are preceded by a test name that is used to interpret the results.

When the test results are printed 268 or replayed 272, the test macro that originally produced the results is executed again. When a test is replayed, a flag is set that tells the macro interpreter that whatever measurement directive is encountered, the measurement should be extracted from a results file in memory 48 instead of being read from the FSM 22. By providing for storage of a test macro or other storage of key strokes and storage of data (as opposed to storage of results screens), the code needed for software which permits review of data is shortened and simplified. A save/edit module 254 allows the operator to store 274 the current results which are not accessible by the calling application in the "permanent results" buffer 52 (which is returned to the calling application). It also allows the operator to delete 276 a previously saved set of test results. The results are assigned a "job name" when they are stored so that they can be retrieved by name at a later time. If a CAS system is the calling application the trouble ticket number will have been passed to the administrative computer as a job name.

The results file manager 216 exists to isolate the handling of the current results file. In this way, the storage format or access method or the results can easily be modified for applications that require different storage formats. This sub-system 216 consists of several functions for accessing the results file.

The Utility Menu 252 also includes options for loading custom tests 262, such as downloading from a remote computer 96, performing a self-test 164, e.g., to test open and shorted lead configurations, and to edit parameter 166.

A module 256 for updating testing parameters is provided. Upon execution, the current parameter settings are displayed and the operator manipulates a cursor to select and modify displayed settings. Examples of parameters which can be modified are units (e.g., feet or meters; Fahrenheit or centigrade), cable gauge settings (19, 22, 24, 25 or 26 gauge), cable type settings (jelly, air or paper), and cable temperature settings. Table III provides a summary of parameter settings, according to one embodiment. A further module 258 displays a menu (not shown) that allows the operator to initiate a file transfer to load macro files into the administrative computer 20 through one of the serial communication ports.

TABLE III

| System Variable | Type | Used With . . . | Values |
|---|---|---|---|
| Dist Flag | numeric | Dist Units | 0 = feet, 1 = meters |
| Feet per Ohm | numeric | Cable Gauge | 19 gauge = 124.24 |
| | | | 22 gauge = 61.75 |
| | | | 24 gauge = 38.54 |
| | | | 26 gauge – 24.00 |
| Meters per Ohm | numeric | Cable Gauge | 19 gauge = 37.87 |
| | | | 22 gauge = 18.821 |
| | | | 24 gauge = 11.747 |
| | | | 26 gauge = 7.315 |
| Feet per nF | numeric | Cable Type | Jelly = 57.39131 |
| | | | Air = 63.61446 |
| | | | Paper = 63.61446 |
| Meters per nF | numeric | Cable Type | Jelly = 17.49287 |
| | | | Air = 19.38969 |
| | | | Paper = 19.38969 |
| Curr Temp | numeric | Temp Scale | Current system temperature (for display only) |
| Curr Fahrenheit | numeric | | Current system temperature in Fahrenheit |

TABLE III-continued

| System Variable | Type | Used With... | Values |
| --- | --- | --- | --- |
| Curr Celsius | numeric | | Current system temperature in Celsius |
| CO Resistance | numeric | | Current system C.O. resistance, from Edit Parameters menu. |
| Pulse Duration | numeric | | Current pulse tone duration from Option Menu selection of Tone Source Menu. |
| Step Duration | numeric | | Current step tone duration from Option Menu selection of Tone Source Menu. |
| Dist Units | text | Dist Flag | "ft" or "meters" |
| Cable Gauge | text | Feet per Ohm | "19 Ga," "22 Ga," or "24 Ga," "26 Ga" |
| Cable-Type | text | Feet per nF | "Jelly," "Air" or "Paper" |
| Temp Scale | text | Temp Scale | "F" or "C" |

The results file manager 216 consists of a number of independent functions. Each function performs a specific operation required by one or more modules in other tester subsystems. Among the functions performed by the results file manager 216 are: retrieval of current file position pointers, setting of current file position pointers, retrieving and setting current data record, appending new results data to a results file, deleting data from the current result position.

A macro interpreter 218 is a system by which all of the tests that can be performed by the tester are implemented (with the exception of the continuous measurement function). In one embodiment, a syntax is established so that users can create programs that address their needs. When the macro interpreter 218 is called, a flag indicates that the test is in "run", "replay" or "print" mode. Each command is validated to determine if it is a recognized command. Among the functions which can be achieved by the macro interpreter are a "dial" process for dialing a telephone over the RJ11 connector, using the modem, the "hang up" command for hanging up the connection, a "print" command to display data on the screen 58, and a "pause" command.

Figure 9:
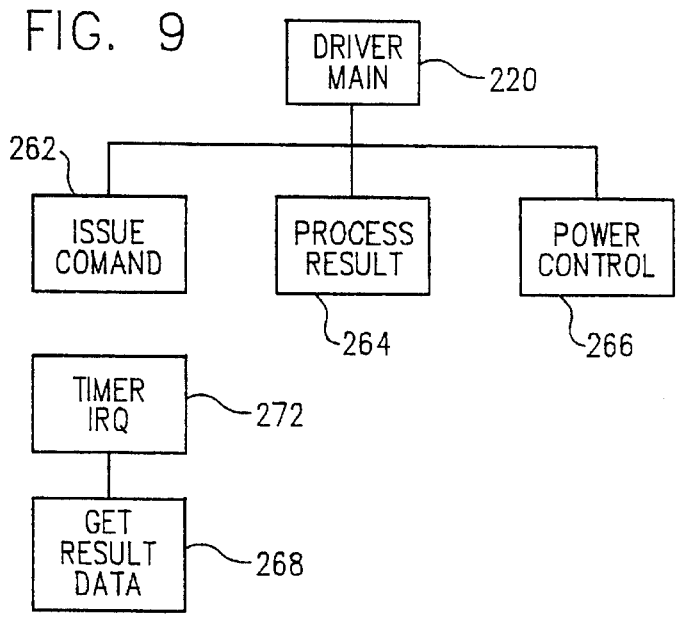
FIG. 9 is a block diagram of components of the driver of FIG. 6.

The tester driver module 220 provides a number of processes as depicted in FIG. 9. The main purpose of the driver is to provide an application interface to the function specific module (FSM) hardware. The driver 220 controls serial communication between the administrative computer and the instrumentation processor and also controls the relay and power configuration of the FSM. The driver 220 also interprets test results returned from the FSM. For example, in some tests, test results are not accepted as accurate until two successive readings are sufficiently close.

Procedures are also provided to conduct tests in a particular order. In some tests, testing starts at a low value and proceeds to a high value. In other cases, testing starts at a high value and proceeds to a low value. Another procedure involves statistically predicting whether a particular measurement is likely to be in a high range or a low range.

The main routine 220 (FIG. 9) calls the "issue command" process 262 to start a command, typically to set relays for a measurement. If the result is not returned before the time-out expires, the command will be retried. A fixed number of retries are attempted before the measurement is aborted. The time-out is detected when the main routine 220 attempts to get data with the "process result" module 264. Process result 264 waits for a response from the interrupt routine and converts the response to a floating point number and a status field. The power control function 266 is executed for power control commands in connection with the power control device 72.

The process results module 264 waits until the interrupt routine gets a complete result stream, then converts the stream to a numeric value. Once a result is returned, the status is checked to see if the result if valid. An error is returned if the status indicates that a valid reading cannot be obtained. If a valid reading has been taken, the result string is converted to a numeric value and that result is ranged, using the ranging information specified in the measurement control table. The "get result" data module 268 is executed off the timer interrupt 272. A pointer to this routine 268 is placed in the timer interrupt vector during initialization. Since measurement data is continually returned from the instrumentation processor once a command has been sent, this process 268 maintains a buffer which contains only the latest results. In addition, this routine 268 manages the serial protocol for received data. When a complete message has been received it is transferred to a result buffer that is used as "mail box" to transfer the data to the application portion of the tester driver, and a flag is set to indicate to the driver that the buffer contains a complete result.

As noted above, the administrative computer can combine the fundamental test results to provide standard or custom test results. The available standard tests represent a suite of commonly-used tests for telephone instrument repair. The apparatus can be user-programmed to provide custom test result which combine fundamental tests as directed by the user-programming. The tests are set up to report the raw data for interpretation by a technician. This approach provides flexibility to the individual operating companies to exercise their own criteria. Each fundamental test is proceeded by voltage level safety checks on all leads to ensure safe operation by a field technician. Requested fundamental tests are then run and measurements displayed in the same format used to display standard tests (FIGS. 11A, 11B, 11H). Typically, multiple measurements are taken by the instrument automatically without additional intervention. This provides the greatest amount of information with the least amount of effort and time for logically grouped tests. For example, "voltage tests" runs voltage on all three possible line combinations, both AC and DC. Standard or custom tests can be selected using test keys 162a–162p (FIG. 10) from any menu. Standard tests are provided in one embodiment.

As described, one embodiment of the present invention provides a single, hand-held unit, which contains administrative computer functions and testing functions. This enables test results to be stored in the administrative computer and correlated with administrative information without manual data entry, thus saving operator time and reducing error. Testing functions are automatically controlled by the administrative computer, thereby assuring compliance with company-preferred test routines or government testing requirements. Automated test reporting of standard or custom testing routines is made possible.

A number of variations and modifications of the present invention can be used. Although the depicted embodiment shows certain circuitry elements being arrayed on specified boards or specified slice or non-slice components of the system, components could be distributed in other ways, such as by, for example, positioning the modem 434 in the upper case 402 rather than the lower case 404 and the like. Although the disclosure includes a description of a T4000 device (FIGS. 1–5) and a T5000 (FIGS. 12–24) a number of the components, functions and/or capabilities described in connection with one of these devices can be used in the other device. For example, an operable device could be constructed which used the keypad configuration of the T4000 (FIG. 10) is used in connection with the T5000 (FIG. 13). E.g., Similarly, it would be possible to integrate an RF modem 514 (such as that described in connection with the T5000 device) into the FSM. Although the present invention has been described in connection with portable or hand-held embodiments, the components, functions and capabilities of the present invention can also be implemented in non-portable and/or non-hand-held devices. Although, in the depicted embodiment, the slice 404 is configured to provide telephone testing capability, slices providing other capabilities can also be used and similarly mechanically and electrically connected to upper and lower portions 402, 404. For example, slices 438 could be configured for testing non-wire telephone systems, such as fiber optic systems, for testing non-telephone communication systems, such as private data communication systems, for supporting general field servicing of electrical devices, e.g., copiers, printers, computers, faxes and the like and/or for testing, repairing, maintaining, data-gathering or billing connected with other installation such as utilities, (including gas, water, electricity and the like). Although only a single slice is provided in the depicted embodiment, it is possible to configure a computer to accommodate more than one slice, to provide a plurality of capabilities. The capabilities of the slice, described above, can be implemented in computers other than the computers depicted in FIGS. 1–5 and 12–24. Slices 438 can also be provided which enhance the capacity of the basic computer 402, 404, without providing additional testing capability, such as slices which provide additional memory, co-processing capabilities, networking capabilities and the like. In this way a computer 402, 404 is provided with expansion capability without the need for a case or housing large enough to accommodate such expansion capability when it is in an unexpanded configuration.

Although embodiments of the invention for telephone testing have been described, the apparatus can be used in other contexts such as for electric, gas, water or other utility repair, billing or data gathering. Testing other than electrical parameter testing can be used or included, such as chemical, medical, biological, physical or other testing. The scope of the invention is described in the following claims.

What is claimed is:

1. Apparatus for performing and controlling testing of electrical equipment, comprising:
   a computer configured in matable, separable first and second cases with at least a first wire coupling said first and second cases for conveying at least a first electrical signal, said first and second cases being matable to provide a single rigid computer device;
   a test circuit housing, containing circuitry for testing electrical equipment, said test circuit housing being selectively and removably positioned between and separating said first and second cases, said test circuit housing being mated to said first and second cases to provide a single rigid device; and
   at least a first wire coupling said circuitry for testing with said computer for conveying at least a second electrical signal for control of said circuitry for testing; said computer being functional even if said test circuit housing is removed.

2. Apparatus, as claimed in claim 1, wherein said circuitry for testing comprises circuitry for testing a telephone subscriber loop, and includes a plurality of contacts selectively coupled to the subscriber loop, a plurality of selectable signal conditioning circuits, selectively coupled to selected contacts to provide a conditioned signal, and an instrumentation processor including instrumentation circuits and a voltage measuring device selectively coupled to the conditioned signal, and providing data representative of an electrical parameter measurement.

3. Apparatus, as claimed in claim 1 wherein said electrical equipment is telephone equipment and wherein said circuitry for testing including at least a first tone generator for transmitting a tone to said telephone equipment.

4. Apparatus, as claimed in claim 1, further comprising an RF modem, coupled to said computer, for transmitting data from and receiving data in said computer without the need to convey said data over a physical medium during the full pathway of said data.

5. Apparatus for performing and controlling testing of electrical equipment, comprising:
   matable, separable first and second cases;
   a computer configured in the first and second cases, the computer including a power supply housed in said second case, and a central processing unit housed in said first case;
   first means coupling said first and second cases for conveying at least a first electrical signal;
   second means for attaching said first and second cases to provide a single rigid computer device, said second means including interconnecting tabs and slots in said first and second cases;
   a housing selectively and removably positioned between and separating said first and second cases;
   third means for testing electrical equipment, said third means being disposed in said housing;
   fourth means for attaching said housing to said first and second cases to provide a single rigid device, said fourth means including interconnecting tabs and slots in said housing which are located and configured to engage said tabs and slots in said first and second cases; and
   fifth means, coupling said third means with said computer for conveying at least a second electrical signal for control of said third means for testing.

6. Apparatus for performing and controlling testing of a telephone subscriber loop and communicating results, comprising:

a computer;

a test circuit housing;

circuitry, supported in said housing, for testing a telephone subscriber loop and including a plurality of contacts selectively coupled to the subscriber loop, a plurality of selectable signal conditioning circuits, selectively coupled to selected contacts to provide a conditioned signal, and an instrumentation processor including instrumentation circuits and a voltage measuring device selectively coupled to the conditioned signal and providing data representative of an electrical parameter measurement, said circuitry being coupled to said computer for conveying testing results to said computer; and an RF modem coupled to said computer, for transmitting said testing results from said computer along a data pathway to a remote computer without the need to convey said testing results over a physical medium during the full extent of said data pathway.

7. Apparatus for performing and controlling testing of a telephone subscriber loop and communicating results, comprising:

a computer;

a test circuit housing;

circuitry, under the control of the computer and supported in said housing, for testing a telephone subscriber loop and including first and second test leads for connecting said circuitry to at least tip and ring lines of the subscriber loop, a signal conditioning circuit, selectively coupled to selected contacts to provide a conditioned signal, and an instrumentation processor including instrumentation circuits and a voltage measuring device selectively coupled to the conditioned signal and providing data representative of an electrical parameter measurement, said circuitry being coupled to said computer for conveying testing results to said computer;

a first fuse coupled in-line with said first test lead; and a second fuse coupled in-line with said second test lead.

8. Apparatus, as claimed in claim 7 wherein said first and second fuses are disposed in a fuse holder contained in said housing, said fuse holder also containing at least one spare fuse, said fuse holder configured to permit replacement of at least one of said first and second fuses with said at least one spare fuse by withdrawal, movement and reinsertion of said fuse holder.

9. Apparatus, as claimed in claim 8 wherein said fuse holder is configured to permit replacement wherein said movement includes rotation of said fuse holder.

10. Apparatus for permitting a user to obtain electrical test results relating to equipment which is to be tested comprising:

an administrative computer programmed to store and communicate information related to the location of the equipment which is to be tested;

a keyboard, coupled to the administrative computer, permitting user input to the administrative computer;

testing apparatus operable under control of the administrative computer, the testing apparatus configured to obtain data indicating values of a plurality of electrical parameters of the equipment which is to be tested;

a memory for storing information coupled to the testing apparatus;

data transfer apparatus coupled between the memory and the testing apparatus for transferring information based on the data into memory, in the absence of manually inputting the information using the keyboard;

an RF modem, coupled to said administrative computer, for transmitting data from and receiving data in said administrative computer without the need to convey said data over a physical medium during the full pathway of said data.

11. Apparatus for providing results of electrical tests correlated with location information, comprising:

an administrative computer which includes a central processing unit;

a memory, coupled to the central processing unit;

a display, coupled to the central processing unit, for displaying information relating to the location of equipment to be tested;

a keyboard, coupled to the central processing unit, for receiving user commands to control the display;

a serial port, coupled to the central processing unit, for transmitting serial data signals;

a power supply means; and

RF modem means, for providing serial communication from the administrative computer;

an instrumentation processor, coupled to the serial port using an optical interface to permit communication between the administrative computer and the instrumentation processor;

a read-only memory coupled to the instrumentation processor for storing program information for the instrumentation processor;

a random-access memory, coupled to the instrumentation processor, for temporary storage of data processed by the instrumentation processor;

an I/O register coupled to the instrumentation processor;

signal processors, having inputs and outputs, which include a plurality of selectable signal filters;

a plurality of selectable terminator resistances; and tip, ring and ground test leads;

a matrix of latchable, controllable relay switches for selectably connecting the test leads to the inputs of the signal processors;

a plurality of relay drivers coupled to the matrix of relay switches and to the I/O register to permit the instrumentation processor to control the controllable relay switches in response to serial data signals received over the serial port from the administrative computer;

an input protection network for coupling the test leads to the matrix of relay switches;

controllable power control means including transformer means for coupling the power supply to the instrumentation processor and to the matrix of relay switches;

means for coupling the RF modem means to a telephone line;

a controllable-gain amplifier, coupled to the RF modem means, and a speaker, coupled to the controllable-gain amplifier, for reproducing audio signals provided over the RF modem means;

control logic, coupled to the administrative computer, for transmitting a first control signal to the controllable-gain amplifier and for transmitting a second control signal from the administrative computer to the controllable power control; and an isolation transformer coupling the RF modem means to the matrix of relay switches.

12. Apparatus, as claimed in claim 11, wherein said display has both a character display capability and a graphics display capability.

13. In an administrative computer, the computer including a central processing unit;

a memory, coupled to the central processing unit;

a display, coupled to the central processing unit, for displaying information relating to the location of equipment to be tested;

a keyboard, coupled to the central processing unit, for receiving user commands to control the display;

said administrative computer disposed in upper and lower matable, separable upper and lower cases;

a method for performing testing on the equipment to be tested, the method comprising:

providing a means for measuring electrical parameters of said equipment to be tested;

separating said upper and lower cases of said administrative computer;

inserting said means for measuring electrical parameters between said upper and lower cases;

electrically coupling said means for measuring electrical parameters to said administrative computer along an electrical pathway;

attaching said means for measuring electrical parameters to said upper and lower cases to provide a single substantially rigid device;

providing control signals from the administrative computer to the means for measuring electrical parameters;

receiving signals from the equipment to be tested;

selectively storing information related to the signals received from the equipment to be tested in the memory of the administrative computer;

reading, from the memory, the information related to the signals received from the equipment;

correlating the information read from the memory with the information relating to the location of the equipment to be tested.

14. A method, as claimed in claim 13, further comprising:

providing a test lead, coupled to said means for measuring electrical parameters;

providing a fuse drawer holding at least first and second fuses, said fuse drawer configured to be removably insertable into said first means to position said first fuse in a location to engage at least said first fuse in-line with said test lead;

withdrawing said fuse drawer;

rotating said fuse drawer to align said second fuse with said location; and inserting said fuse drawer into said first means to engage said second fuse in-line with said test lead.

15. A method, as claimed in claim 13, further comprising:

displaying a plurality of values of an electrical parameter, as the electrical parameters of the equipment to be tested changes, according to a pre-determined display format.

16. A method, as claimed in claim 15, wherein the pre-determined format includes a line-graph of the electrical parameter having time as one axis of the line graph.

17. A method of communicating between a central computer and a field service computer, comprising:

providing a field service computer programmed to store and communicate information related to the location of equipment which is to be tested;

providing a keyboard, coupled to the administrative computer, permitting user input to the administrative computer;

providing a testing apparatus operable under control of the administrative computer, the testing apparatus configured to test a field device needing service and to obtain data indicating values of a plurality of electrical parameters of the equipment which is to be tested;

providing a memory for storing information coupled to the testing apparatus;

providing a data transfer apparatus coupled between the memory and the testing apparatus for transferring information into the memory from the testing apparatus, in the absence of manually inputting the information using the keyboard;

transmitting first administrative information from said central computer to said field service computer over a radio data link, said first administrative information including at least information relating to the location of a field device needing service;

testing said field device with said testing apparatus and storing test data in said field service computer; and transmitting second administrative information from said field service computer to said central computer over a radio data link, said second administrative information including at least information relating to servicing of said field device.

18. A method, as claimed in claim 17, wherein said second administrative information includes at least a portion of said test data.

19. A method, as claimed in claim 17, wherein said step of transmitting second administrative information includes using an RF modem, coupled to said field service computer, to transmit said second administrative information.

* * * * *